United States Patent [19]
Bliss

[11] Patent Number: 6,032,284
[45] Date of Patent: Feb. 29, 2000

[54] TRELLIS CODING SYSTEM FOR DISC STORAGE SYSTEMS

[75] Inventor: William G. Bliss, Thornton, Colo.

[73] Assignee: Cirrus Logic, Inc., Fremont, Calif.

[21] Appl. No.: 08/815,881

[22] Filed: Mar. 12, 1997

[51] Int. Cl.[7] .......................... H04L 25/497; H03M 7/14; G11B 20/14

[52] U.S. Cl. .............................. 714/792; 341/59; 360/40; 360/51

[58] Field of Search ..................................... 714/789, 792, 714/799, 795; 360/48, 51, 40; 341/59

[56] References Cited

U.S. PATENT DOCUMENTS

| | | | |
|---|---|---|---|
| 5,220,466 | 6/1993 | Coker et al. ................................ | 360/46 |
| 5,257,272 | 10/1993 | Fredrickson ............................... | 371/43 |
| 5,258,933 | 11/1993 | Johnson et al. ........................... | 364/602 |
| 5,280,489 | 1/1994 | Fredrickson et al. ..................... | 371/45 |
| 5,293,369 | 3/1994 | Melas et al. ............................... | 369/59 |
| 5,295,128 | 3/1994 | Hutchins et al. .......................... | 369/59 |
| 5,321,559 | 6/1994 | Nguyen et al. ............................ | 360/46 |
| 5,327,440 | 7/1994 | Fredrickson et al. ..................... | 371/43 |
| 5,329,554 | 7/1994 | Behrens et al. ............................ | 375/94 |
| 5,341,249 | 8/1994 | Abbott et al. .............................. | 360/46 |
| 5,359,631 | 10/1994 | Behrens et al. ........................... | 375/120 |
| 5,452,325 | 9/1995 | Brown et al. .............................. | 375/376 |
| 5,485,472 | 1/1996 | Fredrickson ............................... | 371/43 |
| 5,497,384 | 3/1996 | Fredrickson et al. ..................... | 371/43 |
| 5,521,767 | 5/1996 | Weng et al. ................................ | 360/46 |
| 5,526,200 | 6/1996 | Yada ........................................ | 360/51 |
| 5,537,424 | 7/1996 | Karabed et al. ........................... | 371/43 |
| 5,548,600 | 8/1996 | Fredrickson et al. ..................... | 371/43 |
| 5,552,942 | 9/1996 | Ziperovich et al. ....................... | 360/51 |
| 5,585,975 | 12/1996 | Bliss ........................................ | 360/65 |
| 5,604,497 | 2/1997 | Sonntag .................................... | 341/59 |
| 5,642,243 | 6/1997 | Bliss ........................................ | 360/51 |
| 5,696,639 | 12/1997 | Spurbeck et al. .......................... | 360/51 |
| 5,726,818 | 3/1998 | Reed et al. ................................. | 360/51 |
| 5,801,649 | 9/1998 | Fredrickson ............................... | 341/58 |
| 5,805,619 | 9/1998 | Gardner et al. ............................ | 371/61 |
| 5,809,080 | 9/1998 | Karabed et al. ........................... | 375/263 |
| 5,812,334 | 9/1998 | Behrens et al. ............................ | 360/40 |
| 5,812,336 | 9/1998 | Spurbeck et al. .......................... | 360/51 |
| 5,835,295 | 11/1998 | Behrens .................................... | 360/51 |
| 5,859,601 | 1/1999 | Moon et al. ............................... | 341/59 |

OTHER PUBLICATIONS

Karabed et al., "Matched Spectral–Null Codes for Partial–Response Channels", IEEE Transactions on Information Theory, vol. 37, No. 3, May 1991, pp. 818–855.

Melas et al., "An Asynchronous Fully Digital Channel for Magnetic Recording", IEEE Globecom Conference Record, pp. 1144–1147, Dec. 1994.

Sonntag et al., "A High Speed, Low Power PRML Read Channel Device", IEEE Transactions on Magnetics, vol. 31, No. 2, Mar. 1995, pp. 1186–1195.

McEwen et al., "Trellis Codes for (1, k) EEPR4ML with Squared Distance 18", IEEE Transactions on Magnetics, vol. 32, No. 5, Sep. 1996, pp. 3995–3997.

Spurbeck et al., "Interpolated Timing Recovery for Hard Disk Drive Read Channels", ICC '97, pp. 1618–1624, Dec. 1997.

(List continued on next page.)

*Primary Examiner*—Stephen M. Baker
*Attorney, Agent, or Firm*—Howard H. Sheerin; Dan Shifrin

[57] ABSTRACT

In a sampled amplitude read channel for reading data recorded on a disc storage medium, a sequence detector is disclosed which operates according to a time varying trellis state machine matched to a modulation code which constrains the occurrence of tribits to k-modulo-3, and forbids runs of four or longer consecutive NRZI "1" bits. The modulation code enhances the distance property of the sequence detector without significantly decreasing the code rate. Example time varying trellis sequence detectors are disclosed for the EPR4 response and EEPR4 response. Further, the modulation code improves the performance of a sub-sampled read channel (a channel that samples the analog read signal substantially below Nyquist) by coding out the most likely miss-detected data sequences in the presence of sub-sampling. Interpolated timing recovery is disclosed for implementing a sub-sampled read channel employing the time varying sequence detector of the present invention.

20 Claims, 21 Drawing Sheets

OTHER PUBLICATIONS

Razmik Karabed and Paul Siegel, "Coding for Higher Order Partial Response Channels,"*SPIE–Proceedings*, Oct. 23–24, 1995, Philadelphia, PA, vol. 2605.

William G. Bliss and David E.Reed, "Analysis of HDD Thin–Film–Head Read Channel Performance as a Function of Media Thickness and RLL Code d Constraint,", *IEEE Inter Mag* '96, Seattle, WA, Apr. 1996.

Paul H. Siegel and Jack K. Wolf, "Modulation and Coding for Information Storage," *IEEE Communications Magazine*, pp. 68–86, Dec. 1991.

Stephen B. Wicker, *Error Control Systems for Digital Communication and Storage*, pp. 290–332, Prentice–Hall, 1995.

Jan W. M. Bergmans et al., "Partial–Response Decoding of Rate 1/2 Modulation Codes for Digital Storage," *IEEE Transactions On Communications*, vol. 39, No. 11, pp. 1569–1581, Nov. 1991.

Jan W. Bergmans, "A Partial–Response Receiver for Miller–Squared Encoded Signals with Half the Usual Operating Speed," *IEEE Transactions On Magnetics*, vol. 26, No. 5, Sep. 1990.

J. Moon and B. Brickner, "Maximum Transition Run Codes For Data Storage Systems," *IEEE Inter Mag.*, Seattle WA, Apr. 1996.

TRELLIS CODING SYSTEM FOR DISC STORAGE SYSTEMS

FIELD OF INVENTION

The present invention relates to the control of disc storage systems for digital computers, particularly to a trellis modulation code and detector for enhancing the performance of a sub-sampled discrete time read channel.

BACKGROUND OF THE INVENTION

Sampled amplitude read channels are commonly employed in recording devices, such as optical and magnetic storage systems, for detecting and decoding binary data stored on a disc medium. A transducer (read head), positioned in close proximity to the disc, senses alterations on the disc's surface, such as magnetic transitions or optical "pits", which represent the recorded binary data. The surface alterations induce a corresponding change, or pulse, in the analog read signal emanating from the read head. The read channel must detect and translate these pulses into an estimated binary sequence which, in the absence of errors due to system dynamics, will be the originally recorded binary sequence.

In sampled amplitude read channels, the read signal is equalized into a predetermined partial response (e.g., PR4, EPR4, EEPR4, etc.) meaning that the response of the channel to an isolated surface alteration (i.e., an isolated pulse) will take on a particular shape. The output of the channel can then be approximated as a linear combination of time delayed pulses modulated by the binary input sequence; for example, binary "1" bits modulate alternating positive or negative pulses, and binary "0" bits modulate no pulse.

The read channel detects the recorded data by interpreting, at discrete time instances, the actual value of the pulse data. To this end, the read channel comprises a sampling device for sampling the analog read signal, and a timing recovery circuit for synchronizing the samples to the channel or baud rate (code bit rate) . Before sampling the pulses, a variable gain amplifier adjusts the read signal's amplitude to a nominal value, and a low pass analog filter filters the read signal to provide initial equalization and to attenuate channel and aliasing noise. After sampling, a discrete time equalizer equalizes the sample values according to a desired partial response, and a discrete time sequence detector, such as a Viterbi detector, interprets the equalized sample values in context to determine a most likely sequence for the digital data (i.e., maximum likelihood sequence detection (MLSD)). MLSD takes into account the effect of ISI and channel noise in the detection algorithm, thereby decreasing the probability of a detection error. This increases the effective signal to noise ratio and, for a given run-lenth limited RLL (d,k) constraint, allows for significantly higher data density as compared to conventional analog peak detection read channels.

The application of sampled amplitude techniques to digital communication channels is well documented. See Y. Kabal and S. Pasupathy, "Partial Response Signaling", *IEEE Trans. Commun. Tech.*, Vol. COM-23, pp.921–934, September 1975; and Edward A. Lee and David G. Messerschmitt, "Digital Communication", Kluwer Academic Publishers, Boston, 1990; and G. D. Forney, Jr., "The Viterbi Algorithm", *Proc. IEEE*, Vol. 61, pp. 268–278, March 1973.

Applying sampled amplitude techniques to magnetic storage systems is also well documented. See Roy D. Cideciyan, Francois Dolivo, Walter Hirt, and Wolfgang Schott, "A PRML System for Digital Magnetic Recording", *IEEE Journal on Selected Areas in Communications*, Vol. 10 No. 1, January 1992, pp.38–56; and Wood et al, "Viterbi Detection of Class IV Partial Response on a Magnetic Recording Channel", *IEEE Trans. Commun.*, Vol. Com-34, No. 5, pp. 454–461, May 1986; and Coker Et al, "Implementation of PRML in a Rigid disc Drive", *IEEE Trans. on Magnetics*, Vol. 27, No. 6, November 1991; and Carley et al, "Adaptive Continous-Time Equalization Followed By FDTS/DF Sequence Detection", *Digest of The Magnetic Recording Conference*, August 15–17, 1994, pp. C3; and Moon et al, "Constrained-Complexity Equalizer Design for Fixed Delay Tree Search with Decision Feedback", *IEEE Trans. on Magnetics*, Vol. 30, No. 5, September 1994; and Abbott et al, "Timing Recovery For Adaptive Decision Feedback Equalization of The Magnetic Storage Channel", *Globecom'90 IEEE Global Telecommunications Conference* 1990, San Diego, Calif., November 1990, pp.1794–1799; and Abbott et al, "Performance of Digital Magnetic Recording with Equalization and Offtrack Interference", *IEEE Transactions on Magnetics*, Vol. 27, No. 1, January 1991; and Cioffi et al, "Adaptive Equalization in Magnetic-disc Storage Channels", *IEEE Communication Magazine*, February 1990; and Roger Wood, "Enhanced Decision Feedback Equalization", *Intermag'90*.

Timing recovery in sampled amplitude read channels attempts to synchronize the pulse samples to the baud rate. In conventional sampled amplitude read channels, timing recovery synchronizes a sampling clock by minimizing an error between the signal sample values and estimated sample values. A pulse detector or slicer determines the estimated sample values from the read signal samples. Even in the presence of intersymbol interference (ISI) the sample values can be estimated and, together with the signal sample values, used to synchronize the sampling of the analog pulses in a decision-directed feedback system.

Typically, a phase-locked-loop (PLL) implements the decision-directed timing recovery system by generating a phase error estimate based on the difference between the estimated samples and the read signal samples. The phase error is filtered, and then used to synchronize the channel samples to the channel rate.

Conventionally, the filtered phase error adjusts the frequency of a sampling clock which is typically the output of a variable frequency oscillator (VFO). The output of the VFO controls a sampling device, such as an analog-to-digital (A/D) converter, thereby synchronizing the sampling of the read signal to the baud rate.

The maximum likelihood sequence detector for detecting the estimated data sequence from the synchronous sample values typically operates according to a state machine, or trellis, "matched" to the particular partial response target. As mentioned above, the sequence detector compares a predetermined number of consecutive input samples to a number of expected or ideal sample sequences corresponding to valid binary output sequences, taking into account ISI, and selects the most likely sequence in Euclidean space as the correct binary output sequence (recorded sequence). Enough noise in the read signal—due to misequalization, timing errors, etc.—can cause the sequence detector to select the wrong output sequence. As explained in greater detail below, errors are most likely to occur relative to a "minimum distance" property of the trellis code, which typically is defined as the mimimum Euclidean distance ($d_{min}^2$) between the sample values of valid data sequences.

It is well known that certain coding schemes, referred to as trellis codes, can improve the performance of a trellis sequence detector by "coding out" input data sequences that may result in a minium distance error event when detected. In certain cases, a trellis code can code out all of the input data sequences that may result in a minimum distance error event, thereby increasing the minimum distance property of the detector. For example, a RLL d=1 constraint (which is a trellis code when the trellis detector is matched to the constraint) increases the minimum distance of an uncoded EEPR4 read channel from $d_{min}^2=6$ to $d_{min}^2=10$. The increased distance provided by the d=1 constraint, however, comes at the cost of decreasing the user data density and the user data rate due to the overhead of the code rate (e.g., the code rate of a conventional RLL (1,7) code is $2/3$). Thus, to achieve the same user data density and user data rates as an uncoded system, the channel data density and channel data rate must be increased, thereby reducing the coding gain provided by the code constraint.

Other codes have been identified that provide the same distance enhancing property as the RLL d=1 code but with a more efficient code rate. For example, in "Coding for Higher Order Partial Response Channels," *SPIE*, Vol. 2605, 1995, Razmik Karabed and Paul H. Siegel disclose an EEPR4 trellis code that codes out the sequences "101" and "010" (in NRZ) which provides the same 2.2 dB coding gain as the RLL d=1 code but with a 20% increase in code rate (rate $4/5$ as compared to rate $2/3$). The trellis detector is modified by simply deleting the states and branches associated with the forbidden sequences "101" and "010". Similarly, in "Maximum Transition Run Codes for Data Storage Systems," *Intermag '96*, p. HB-10, 1996, Jaekyun Moon and Barret Brickner disclose an EEPR4 trellis code that codes out the occurrence of three or more consecutive transitions ("1" bits in NRZI), which also provides the same coding gain as the RLL d=1 code but with a higher code rate (a maximum theoretical capacity of 0.8791).

The present invention is a trellis code that enhances the distance property of a trellis detector similar to the above described prior art trellis codes, but with an improved theoretical capacity of 0.9032. Further, the trellis code of the present invention provides coding gain in a "sub-sampled" read channel—a read channel that samples the analog read signal substantially less than the baud rate rather than at the baud rate. Sub-sampling increases the user data rate without needing to increase the speed of the sampling and timing recovery circuitry. Timing recovery is implemented by sampling the read signal asynchronously and interpolating to synchronous sample values.

Thus, the present invention allows for higher user data densities by enhancing the distance property of a trellis sequence detector through a high rate trellis code, and it increases the user data rate through sub-sampling and interpolation.

SUMMARY OF THE INVENTION

In a sampled amplitude read channel for reading data recorded on a disc storage medium, a sequence detector is disclosed which operates according to a time varying trellis state machine matched to a modulation code which constrains the occurrence of tribits to k-modulo-3, and forbids runs of four or longer consecutive NRZI "1" bits. The modulation code enhances the distance property of the sequence detector without significantly decreasing the code rate. Example time varying trellis sequence detectors are disclosed for the EPR4 response and EEPR4 response. Further, the modulation code improves the performance of a sub-sampled read channel (a channel that samples the analog read signal substantially below Nyquist) by coding out the most likely miss-detected data sequences in the presence of sub-sampling. Interpolated timing recovery is disclosed for implementing a sub-sampled read channel employing the time varying sequence detector of the present invention.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Data Format

Figure 1A:
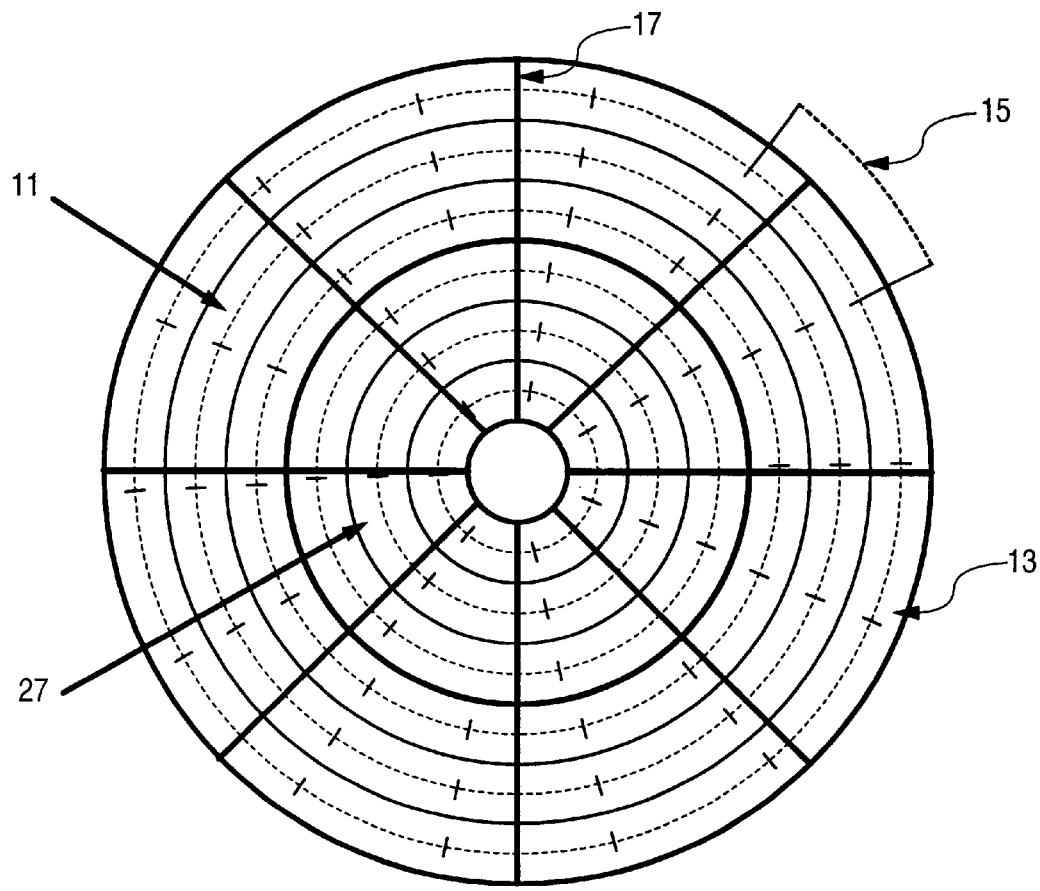
FIG. 1A shows an exemplary data format of a magnetic disc having a plurality of concentric tracks comprised of a plurality of user data sectors and embedded servo data wedges.

FIG. 1A shows an exemplary data format of a magnetic disc medium comprising a series of concentric data tracks 13 wherein each data track 13 comprises a plurality of sectors 15 with embedded servo wedges 17. A servo controller (not shown) processes the servo data in the servo wedges 17 and, in response thereto, positions a read/write head over a desired track. Additionally, the servo controller processes servo bursts within the servo wedges 17 to keep the head aligned over a centerline of the desired track while writing and reading data. The servo wedges 17 may be detected by a simple discrete time pulse detector or by a discrete time sequence detector. In any case, the servo wedges 17 typically include a preamble and a sync mark for synchronizing to the servo data, similar to the user data sectors 15.

Figure 1B:
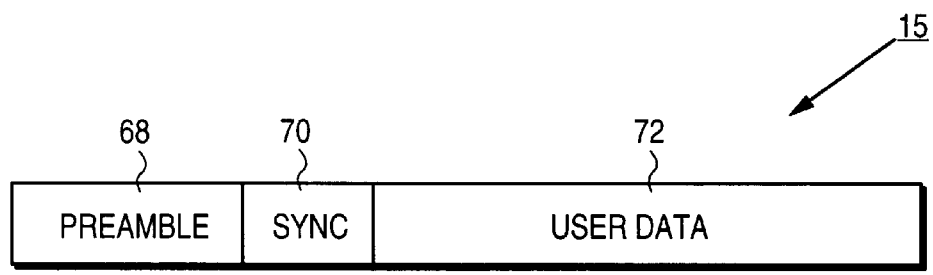
FIG. 1B shows an exemplary format of a user data sector.

FIG. 1B shows the format of a user data sector 15 comprising an acquisition preamble 68, a sync mark 70, and user data 72. Timing recovery in the read channel processes the acquisition preamble 68 to acquire the correct sampling frequency and phase before reading the user data 72, and the sync mark 70 demarks the beginning of the user data 72.

The storage capacity at the outer tracks can be increased due to the increase in circumferential recording area (i.e. due to the decrease in ISI). Accordingly, the disc shown in FIG. 1A is partitioned into an outer zone 11 comprising fourteen data sectors per track, and an inner zone 27 comprising seven data sectors per track. In practice, the disc is actually partitioned into several zones, wherein the capacity and data rate increases from the inner to outer zones.

Conventional Sampled Amplitude Read Channel

Figure 2:
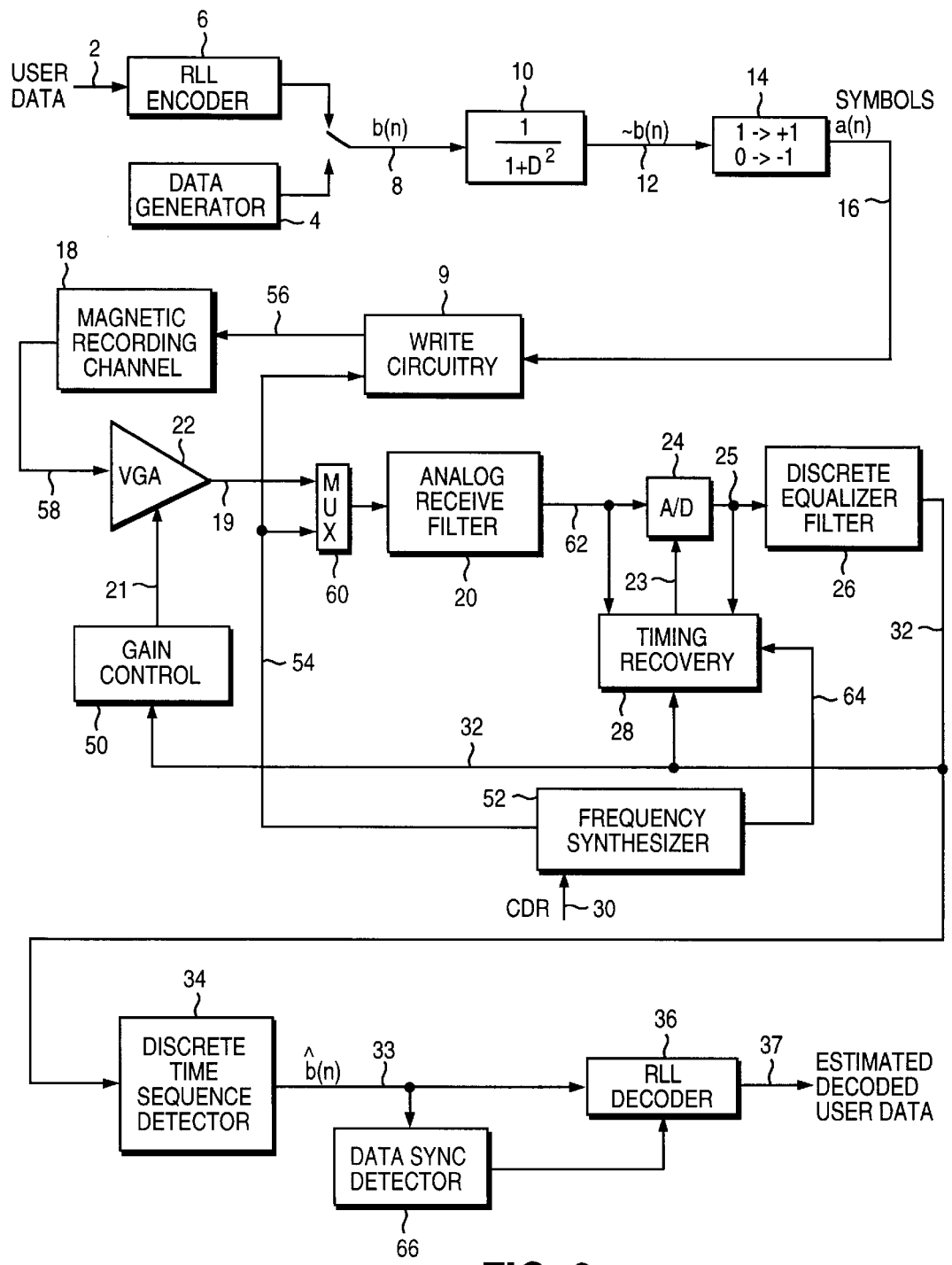
FIG. 2 is a block diagram of a conventional PR4 sampled amplitude read channel employing synchronous sampling timing recovery.

Referring now to FIG. 2, shown is a detailed block diagram of a conventional sampled amplitude read channel. During a write operation, a data generator 4 outputs preamble data 68 and a sync mark 70 recorded on the disc prior to recording the user data 72 (see FIG. 1B). An run-length limited (RLL) encoder 6 encodes the user data 2 into a binary sequence b(n) 8 according to a conventional RLL (d,k) constraint. A precoder 10 ($1/(1+D^2)$ for PR4 read channels) precodes the binary sequence b(n) 8 in order to compensate for the transfer function of the recording channel 18 and equalizer filters to form a precoded sequence ~b(n) 12. The precoded sequence ~b(n) 12 is converted into symbols a(n) 16 by translating 14 ~b(N)=0 into a(N)=−1, and ~b(N)=1 into a(N)=+1. Write circuitry 9, responsive to the symbols a(n) 16, modulates the current in the recording head coil at the channel or baud rate 1/T to record the binary sequence onto the media. A frequency synthesizer 52 provides a baud rate write clock 54 to the write circuitry 9 and is adjusted by a channel data rate signal (CDR) 30 according to the zone the recording head is over.

When reading the recorded binary sequence from the media, timing recovery 28 first locks to the write frequency by selecting, as the input to the read channel, the write clock 54 through a multiplexor 60. Once locked to the write frequency, the multiplexor 60 selects the signal 19 from the read head as the input to the read channel in order to acquire an acquisition preamble 68 recorded on the disc preceding the recorded user data 72 as shown in FIG. 1B. A variable gain amplifier 22 adjusts the amplitude of the analog read signal 58, and an analog filter 20 provides initial equalization toward the desired response as well as attenuating aliasing noise. A sampling device 24 samples the analog read signal 62 from the analog filter 20, and a discrete time equalizer filter 26 provides further equalization of the sample values 25 toward the desired response. In partial response recording, for example, the desired response is often selected from Table 1:

TABLE 1

| Channel | Transfer Function | Dipulse Response |
|---|---|---|
| PR4 | $(1 - D)(1 + D)$ | 0, 1, 0, −1, 0, 0, 0, . . . |
| EPR4 | $(1 - D)(1 + D)^2$ | 0, 1, 1, −1, −1, 0, 0, . . . |
| EEPR4 | $(1 - D)(1 + D)^3$ | 0, 1, 2, 0, −2, −1, 0, . . . |

After equalization, the equalized sample values 32 are applied to a decision directed gain control 50 and timing recovery 28 circuit for adjusting the amplitude of the read signal 58 and the frequency and phase of the sampling device 24, respectively. Gain control 50 adjusts the gain of variable gain amplifier 22 over line 21 in order to match the magnitude of the channel's frequency response to the desired partial response, and timing recovery 28 adjusts the frequency of sampling device 24 over line 23 in order to synchronize the equalized samples 32 to the baud rate. Frequency synthesizer 52 provides a course center frequency setting to the timing recovery circuit 28 over line 64 in order to center the timing recovery frequency over temperature, voltage, and process variations.

The equalized samples Y(n) 32 are ultimately input into a discrete time sequence detector 34, such as a maximum likelihood (ML) Viterbi sequence detector, which detects an estimated binary sequence ^b(n) 33 from the sample values. An RLL decoder 36 decodes the estimated binary sequence ^b(n) 33 from the sequence detector 34 into estimated user data 37. A data sync detector 66 detects a sync mark 70 (shown in FIG. 1B) in the data sector 15 in order to frame operation of the RLL decoder 36. In the absence of errors, the estimated binary sequence ^b(n) 33 matches the recorded binary sequence b(n) 8, and the decoded user data 37 matches the recorded user data 2.

Improved Sampled Amplitude Read Channel

Figure 3:
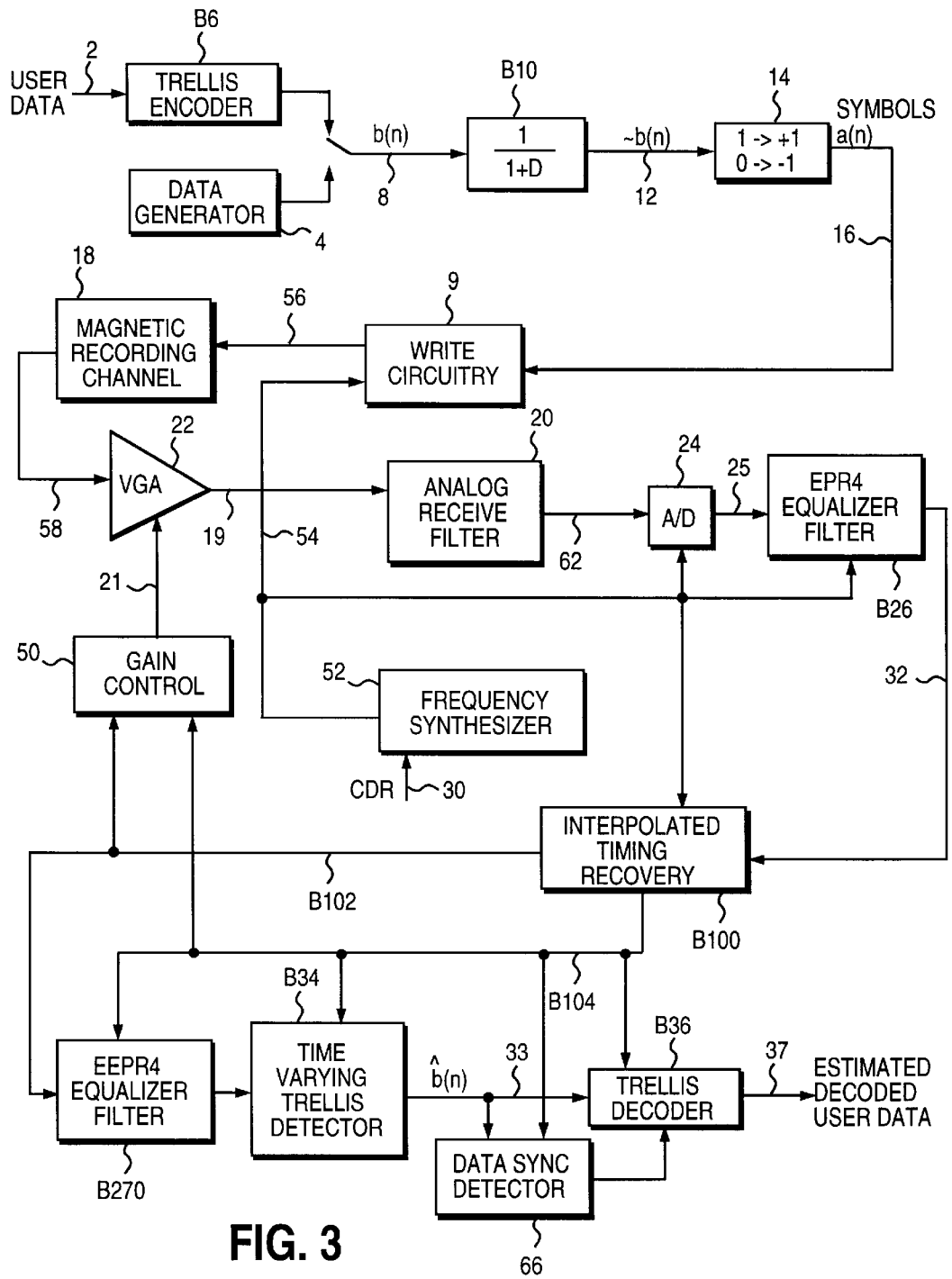
FIG. 3 is a block diagram of the sampled amplitude read channel of the present invention employing trellis encoding/decoding, interpolated timing recovery, EPR4/EEPR4 equalizers for timing recovery and sequence detection, respectively, and a time varying tellis sequence detector.

FIG. 3 shows the improved sampled amplitude read channel of the present invention wherein the conventional RLL encoder 6 of FIG. 2 has been replaced by a trellis encoder B6 for implementing the trellis code constraints described below. The read signal is preferably equalized into an EEPR4 response. As such, the $1/(1+D^2)$ PR4 precoder 10 of FIG. 2 has been replaced by a 1/(1+D) precoder B10, and the read channel preferably includes a first discrete time equalizer B26 for equalizing the sample values into an EPR4 response optimized for timing recovery B100, and a second discrete time equalizer B270 for equalizing the sample values into an EEPR4 response optimized for sequence detection B34.

Also in the preferred embodiment, the conventional sampled timing recovery 28 of FIG. 2 has been replaced by interpolated timing recovery B100 which is more reliable due to the mostly digital implementation. The frequency synthesizer 52 generates a baud rate write clock 54 applied to the write circuitry 9 during write operations, and an asynchronous read clock 54 during read operations for clocking the sampling device 24, the EPR4 discrete time equalizer filter B26, and the interpolated timing recovery B100 at a frequency relative to the current zone (CDR 30). In an alternative embodiment, a first frequency synthesizer generates the write clock, and a second frequency synthesizer generates the read clock.

The interpolated timing recovery B100 interpolates the equalized sample values 32 to generate interpolated sample values B102 substantially synchronized to the channel or baud rate of the current zone. A time varying trellis sequence detector B34 matched to the code constraints described below detects an estimated binary sequence 33 representing the user data from the interpolated sample values B102 (synchronous sample values). The estimated data sequence 33 is then decoded by a trellis decoder B36 which implements the reverse mapping of the trellis encoder B6. The interpolated timing recovery B100 further generates a synchronous data clock B104 for clocking operation of the gain control 50, EEPR4 equalizer filter B270, time varying trellis sequence detector B34, sync mark detector 66 and trellis decoder B36. The implementations for interpolated timing recovery B100 and the synchronous data clock B104 are described below in contrast to the conventional synchronous sampling timing recovery 28 of FIG. 2.

Synchronous Sampling Timing Recovery

Figure 4A:
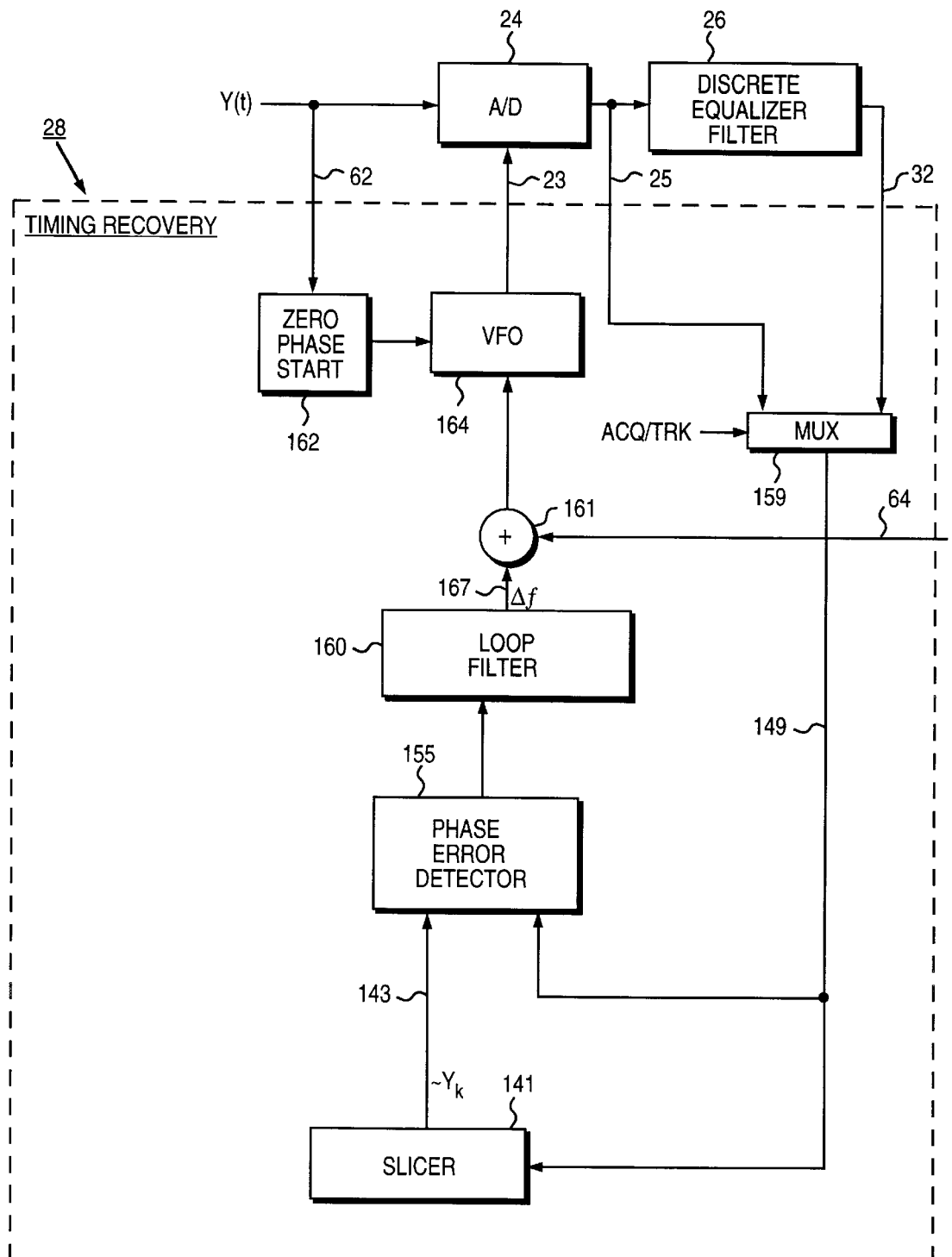
FIG. 4A shows details of the synchronous sampling timing recovery of FIG. 2.

An overview of the conventional synchronous sampling timing recovery 28 of FIG. 2 is shown in FIG. 4A. The output 23 of a variable frequency oscillator (VFO) 164 controls the sampling clock of a sampling device 24, which is typically an analog-to-digital converter (A/D) in digital read channels. A multiplexer 159 selects the unequalized sample values 25 during acquisition and the equalized sample values 32 during tracking, thereby removing the discrete equalizer filter 26 and its associated latency from the timing recovery loop during acquisition. A phase error detector 155 generates a phase error in response to the sample values received over line 149 and estimated sample values $\sim Y_k$ from a sample value estimator 141, such as a slicer in a d=0 PR4 read channel, over line 143. A loop filter 160 filters the phase error to generate a frequency offset $\Delta f$ 167 that settles to a value proportional to a frequency difference between the sampling clock 23 and the baud rate. The frequency offset $\Delta f$ 167, together with the center frequency control signal 64 from the frequency synthesizer 52, adjust the sampling clock 23 at the output of the VFO 164 in order to synchronize the sampling to the baud rate.

A zero phase start 162 circuit suspends operation of the VFO 164 at the beginning of acquisition in order to minimize the initial phase error between the sampling clock 23 and the read signal 62. This is achieved by disabling the VFO 164, detecting a zero crossing in the analog read signal 62, and then re-enabling the VFO 164 after a predetermined delay between the detected zero crossing and the first baud rate sample.

Interpolated Timing Recovery

Figure 4B:
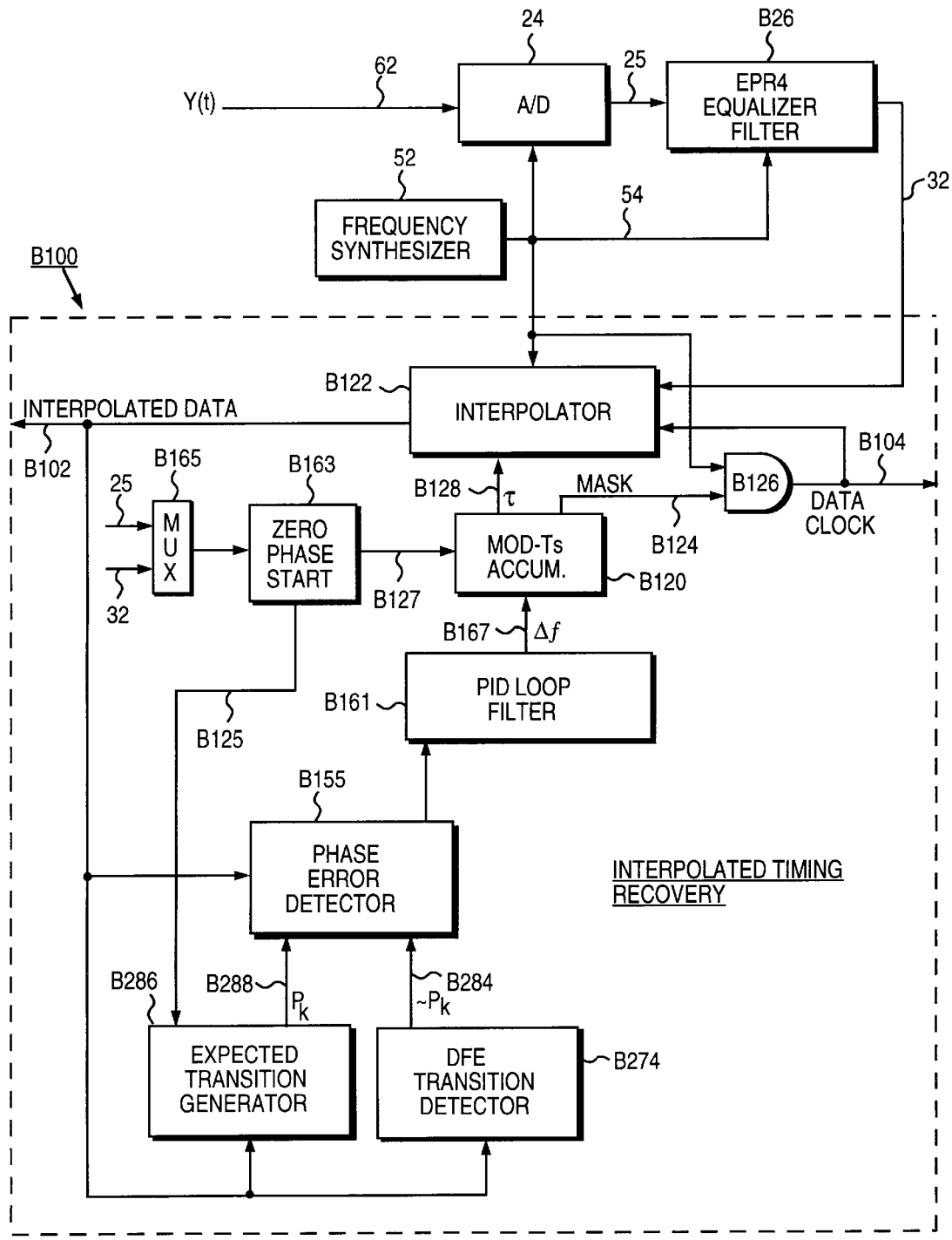
FIG. 4B and 4C show details of interpolated timing recovery of the present invention.

The interpolated timing recovery B100 of the present invention is shown in FIG. 4B. The VFO 164 in the conventional timing recovery of FIG. 4A is replaced with a modulo-Ts accumulator B120 and an interpolator B122. In addition, an expected transition generator B286, responsive to interpolated sample values B102, generates expected transitions $P_k$ used by the phase error detector B155 to compute the phase error during acquisition. The expected transition generator B286 operates according to a state machine (initialized by a zero phase start circuit B163) that generates expected transitions $P_k$ B288 with respect to the known data pattern in the acquisition preamble 68. During tracking, a decision-feedback equalizing (DFE) transition detector B274 (see FIG. 4C) generates estimated transitions $\sim P_k$ from the interpolated sample values B102 for use in computing the phase error. The data clock B104 is generated at the output of an AND gate B126 in response to the sampling clock 54 and a mask signal B124 from the modulo-Ts accumulator B120 as discussed in further detail below. The phase error detector B155 and the DFE transition detector B274 process interpolated sample values B102 at the output of the interpolator B122 rather than the channel sample values 32 at the output of the discrete equalizer filter 26 as in FIG. 4A. A PID loop filter B161 controls the closed loop frequency response similar to the loop filter B160 of FIG. 4A.

In the interpolated timing recovery of the present invention, locking a VFO to a reference frequency before acquiring the preamble is no longer necessary; multiplexing 60 the write clock 54 into the analog receive filter 20 (as in FIG. 2) is not necessary. Further, the sampling device 24 and the discrete equalizer filter 26, together with their associated delays, have been removed from the timing recovery loop; it is not necessary to multiplex 159 around the equalizer filter 26 during acquisition as in FIG. 4A. However, it is still necessary to acquire a preamble 68 before tracking the user data 72. To this end, a zero phase restart (ZPR) B163 minimizes the initial phase error between the interpolated sample values and the baud rate at the beginning of acquisition similar to the ZPR 162 of FIG. 4A. However, rather than suspend operation of a sampling VFO 164, the ZPR B163 for interpolated timing recovery computes an initial phase error $\tau$ from the A/D 24 sample values 25 or the equalized sample values 32 (as selected through multiplexer B165) and loads this initial phase error $\tau$ into the modulo-Ts accumulator B120 over line B127. The ZPR B163 also generates a control signal B125 for initializing the starting state of the expected transition generator B286.

Figure 4C:
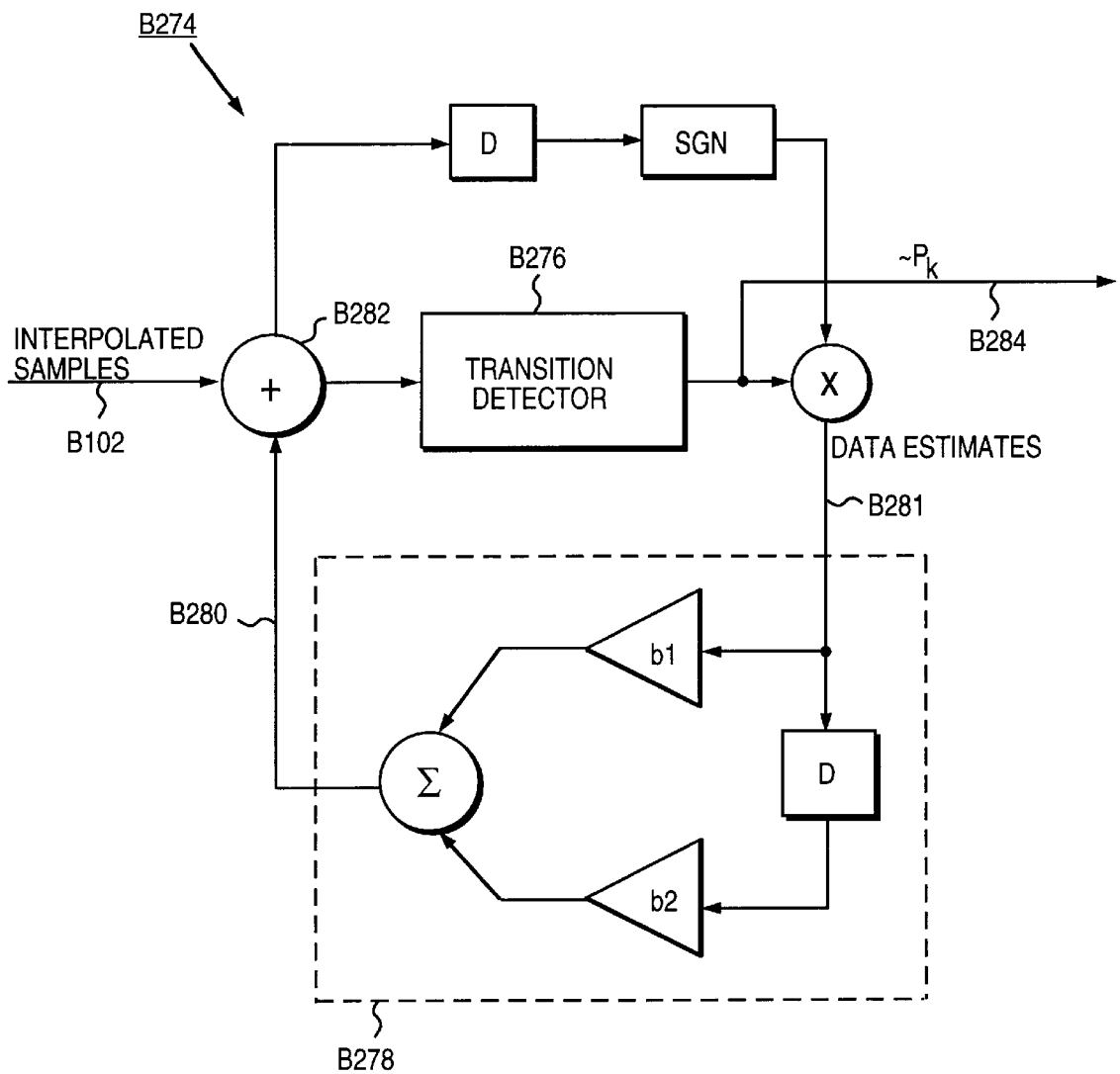

FIG. 4C shows a block diagram of the DFE transition detector B274 of FIG. 4B. The decision feedback equalization (DFE) of FIG. 4C is implemented by filtering B278 data estimates B281, computed as the sign of the sample value at an estimated transition $\sim P_k$ output by transition detector B276, and adding the filter output B280 to the interpolated samples B102 at adder B282. In this manner, the decision directed equalization improves the accuracy of the transition detector B276 when the analog read signal 62 is subsampled. For more details concerning the transition detector B276, refer to U.S. Pat. No. 5,329,544 entitled "Digital Pulse Detector."

For more details concerning the PID loop filter B161 of FIG. 4B, refer to U.S. Pat. No. 5,572,558 entitled "PID Loop Filter for Timing Recovery in a Sampled Amplitude Read Channel." For more details concerning the phase error detector B151, refer to U.S. Pat. No. 5,359,631 entitled "Timing Recovery Circuit for Synchronous Waveform Sampling." For more details concerning the zero phase restart B163 and expected transition generator B286, refer to U.S. patent application Ser. No. 08/751,880 entitled "Zero Phase Restart for Interpolated Timing Recovery in a Sampled Amplitude Read Channel."

The interpolator B122 of FIG. 4B comprises a time varying FIR filter responsive to the interpolation interval $\tau$ B128 for computing the interpolated sample values B102. A detailed description of the modulo-Ts accumulator B120, data clock B104, and interpolator B122 is provided in the following section.

Interpolator

Figure 5:
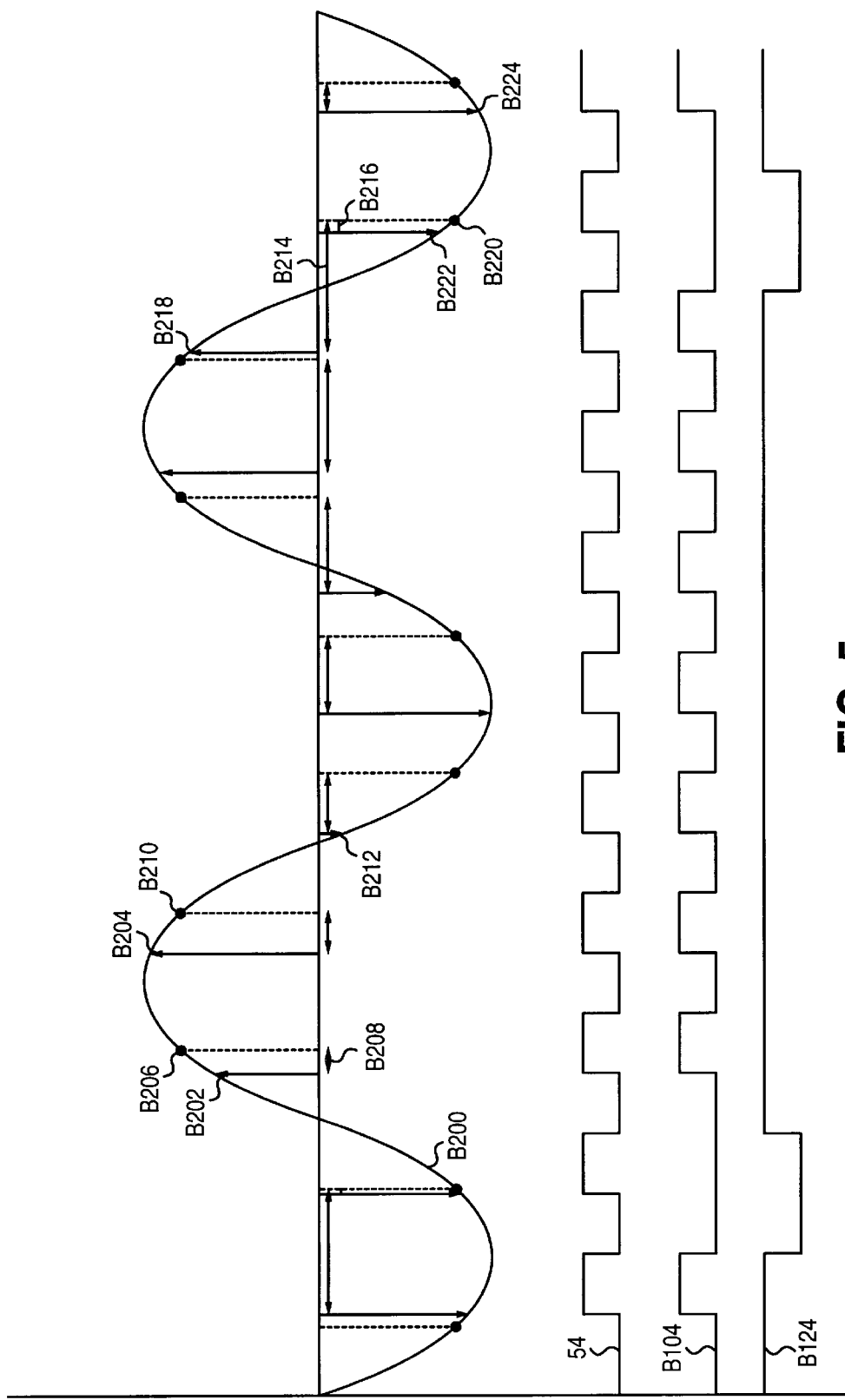
FIG. 5 illustrates operation of interpolated timing recovery and the data clock when synchronizing to the acquisition preamble.

The interpolator B122 of FIG. 4B is understood with reference to FIG. 5 which shows a sampled 2T acquisition preamble signal B200. The target synchronous sample values B102 are shown as black circles and the asynchronous channel sample values 32 as vertical arrows. Beneath the sampled preamble signal is a timing diagram depicting the corresponding timing signals for the sampling clock 54, the data clock B104 and the mask signal B124 of FIG. 4B. As can be seen in FIG. 5, the preamble signal B200 is sampled slightly faster than the baud rate (the rate of the target values).

The function of the interpolator is to estimate the target sample value by interpolating the channel sample values. For illustrative purposes, consider a simple estimation algorithm, linear interpolation:

$$Y(N-1) = x(N-1) + \tau \cdot (x(N) - x(N-1)) \quad (1)$$

where $x(N-1)$ and $x(N)$ are the channel samples surrounding the target sample, and $\tau$ is an interpolation interval proportional to a time difference between the channel sample value $x(N-1)$ and the target sample value. The interpolation interval $\tau$ is generated at the output of modulo-Ts accumulator B120 which accumulates the frequency offset signal $\Delta f$ B167 at the output of the PID loop filter B161:

$$\tau = \left( \sum \Delta f \right) MOD\ TS \quad (2)$$

where Ts is the sampling period of the sampling clock 54. Since the sampling clock 54 samples the analog read signal 62 slightly faster than the baud rate, it is necessary to mask the data clock every time the accumulated frequency offset $\Delta f$, integer divided by Ts, increments by 1. Operation of the data clock B104 and the mask signal B124 generated by the modulo-Ts accumulator B120 is understood with reference to the timing diagram of FIG. 5.

Assuming the interpolator implements the simple linear equation (1) above, then channel sample values B202 and B204 are used to generate the interpolated sample value corresponding to target sample value B206. The interpolation interval $\tau$ B208 is generated according to equation (2) above. The next interpolated sample value corresponding to the next target value B210 is computed from channel sample values B204 and B212. This process continues until the interpolation interval $\tau$ B214 would be greater than Ts except that it "wraps" around and is actually $\tau$ B216 (i.e., the accumulated frequency offset $\Delta f$, integer divided by Ts, increments by 1 causing the mask signal B124 to activate). At this point, the data clock B104 is masked by mask signal B124 so that the interpolated sample value corresponding to the target sample value B220 is computed from channel sample values B222 and B224 rather than channel sample values B218 and B222.

The simple linear interpolation of equation (1) will only work if the analog read signal is sampled at a much higher frequency than the baud rate. This is not desirable since operating the channel at higher frequencies increases its complexity and cost. Therefore, in the preferred embodiment the interpolator B122 is implemented as a filter responsive to more than two channel samples to compute the interpolated sample value.

The ideal discrete time phase interpolation filter has a flat magnitude response and a constant group delay of $\tau$:

$$C_\tau(e^{j\omega}) = e^{j\omega\tau} \quad (3)$$

which has an ideal impulse response:

$$\sin c(\pi \cdot (n - \tau/T_s)). \quad (4)$$

Unfortunately, the above non-causal infinite impulse response (4) cannot be realized. Therefore, the impulse response of the interpolation filter is designed to be a best fit approximation of the ideal impulse response (4). This can be accomplished by minimizing a mean squared error between the frequency response of the actual interpolation filter and the frequency response of the ideal interpolation filter (3). This approximation can be improved by taking into account the spectrum of the input signal, that is, by minimizing the mean squared error between the input spectrum multiplied by the actual interpolation spectrum and the input spectrum multiplied by the ideal interpolation spectrum:

$$\overline{C}_\tau(e^{j\omega})X(e^{j\omega}) - C_\tau(e^{j\omega})X(e^{j\omega}) \quad (5)$$

where $\overline{C}_\tau(e^{j\omega})$ is the spectrum of the actual interpolation filter, and $X(e^{j\omega})$ is the spectrum of the input signal. From equation (5), the mean squared error is represented by:

$$E_\tau^2 = \frac{1}{2\pi} \int_{-\pi}^{\pi} |\overline{C}_\tau(e^{j\omega}) - e^{j\omega\tau}|^2 |X(e^{j\omega})|^2 d\omega \quad (6)$$

where $X(e^{j\omega})$ is the spectrum of the read channel (e.g., PR4, EPR4, EEPR4 of Table 1 or some other partial response spectrum).

In practice, the above mean squared error equation (6) is modified by specifying that the spectrum of the input signal is bandlimited to some predetermined constant $0 \leq \omega \leq \alpha\pi$ where $0 < \alpha < 1$; that is:

$$|X(e^{j\omega})| = 0, \text{ for } |\omega| \geq \alpha\pi.$$

Then equation (6) can be expressed as:

$$E_{\tau,\alpha}^2 = \frac{1}{2\pi} \int_{-\alpha\pi}^{\alpha\pi} |\overline{C}_\tau(e^{j\omega}) - e^{j\omega\tau}|^2 |X(e^{j\omega})|^2 d\omega. \quad (7)$$

The solution to the minimization problem of equation (7) involves expressing the actual interpolation filter in terms of its coefficients and then solving for the coefficients that minimize the error in a classical mean-square sense.

The actual interpolation filter can be expressed as the FIR polynomial:

$$\overline{C}_\tau(e^{j\omega}) = \sum_{n=-R}^{n=R-1} C_\tau(n) e^{-j\omega n} \quad (8)$$

where 2R is the number of taps in each interpolation filter and the sample period Ts has been normalized to 1. A mathematical derivation for an interpolation filter having an even number of coefficients is provided below. It is within the ability of those skilled in the art to modify the mathematics to derive an interpolation filter having an odd number of coefficients.

Substituting equation (8) into equation (7) leads to the desired expression in terms of the coefficients $C_\tau(n)$:

$$E_{\tau,\alpha}^2 = \frac{1}{2\pi} \int_{-\alpha\pi}^{\alpha\pi} \left| \sum_{n=-R}^{n=R-1} C_\tau(n) e^{-j\omega n} - e^{j\omega\tau} \right|^2 |X(e^{j\omega})|^2 d\omega. \quad (9)$$

The next step is to take the derivatives of equation (9) with respect to the coefficients $c_\tau(n)$ and set them to zero:

$$\frac{\partial E_{\tau,\alpha}^2}{\partial C_\tau(n_o)} = 0 \text{ for } n_o = -R, \ldots, 0, 1, \ldots, R-1. \quad (10)$$

After careful manipulation, equation (10) leads to:

$$\int_{-\alpha\pi}^{\alpha\pi} \left[ \left( \sum_{n=-R}^{n=R-1} C_\tau(n) \cos(\omega(n_o - n)) \right) - \cos(\omega(n_o + \tau)) \right] |X(e^{j\omega})| d\omega = 0 \quad (11)$$

for $n_o = -R, \ldots, 0,1, \ldots, R-1$.
Defining $\phi(r)$ as:

$$\phi(r) = \int_{-\alpha\pi}^{\alpha\pi} |X(e^{j\omega})|^2 \cos(\omega r) d\omega \quad (12)$$

and substituting equation (12) into equation (11) gives:

$$\sum_{n=-R}^{n=R-1} C_\tau(n) \phi(n - n_o) = \phi(n_o + \tau) \quad (13)$$

for $n_o = -R, \ldots, 0,1, \ldots, R-1$.
Equation (13) defines a set of 2R linear equations in terms of the coefficients $c_\tau(n)$. Equation (13) can be expressed more compactly in matrix form:

$$\Phi_T C_\tau = \Phi_\tau$$

where $C_\tau$ is a column vector of the form:

$$C_\tau = [c_\tau(-R), \ldots, c_\tau(0), \ldots, c_\tau(R-1)]^t$$

$\Phi_T$ is a Toeplitz matrix of the form:

$$\Phi_T = \begin{bmatrix} \phi(0) & \phi(1) & \ldots & \phi(2R-1) \\ \phi(1) & \phi(0) & & \\ \vdots & & & \vdots \\ \phi(2R-1) & & \ldots & \phi(0) \end{bmatrix}$$

and $\Phi_\tau$ is a column vector of the form:

$$\Phi_\tau = [\phi(-R+\tau), \ldots, \phi(\tau), \phi(1+\tau), \ldots, \phi(R-1+\tau)]^t. \quad (14)$$

The solution to equation (14) is:

$$C_\tau = \Phi_T^{-1} \Phi_\tau \quad (15)$$

where $\Phi_T^{-1}$ is an inverse matrix that can be solved using well known methods.

TABLE 2

| $\tau \cdot 32/Ts$ | C(-2) | C(-1) | C(0) | C(1) | C(2) | C(3) |
|---|---|---|---|---|---|---|
| 0 | 0.0000 | -0.0000 | 1.0000 | 0.0000 | -0.0000 | 0.0000 |
| 1 | 0.0090 | -0.0231 | 0.9965 | 0.0337 | -0.0120 | 0.0068 |
| 2 | 0.0176 | -0.0445 | 0.9901 | 0.0690 | -0.0241 | 0.0135 |
| 3 | 0.0258 | -0.0641 | 0.9808 | 0.1058 | -0.0364 | 0.0202 |
| 4 | 0.0335 | -0.0819 | 0.9686 | 0.1438 | -0.0487 | 0.0268 |
| 5 | 0.0407 | -0.0979 | 0.9536 | 0.1829 | -0.0608 | 0.0331 |
| 6 | 0.0473 | -0.1120 | 0.9359 | 0.2230 | -0.0728 | 0.0393 |
| 7 | 0.0533 | -0.1243 | 0.9155 | 0.2638 | -0.0844 | 0.0451 |
| 8 | 0.0587 | -0.1348 | 0.8926 | 0.3052 | -0.0957 | 0.0506 |
| 9 | 0.0634 | -0.1434 | 0.8674 | 0.3471 | -0.1063 | 0.0556 |
| 10 | 0.0674 | -0.1503 | 0.8398 | 0.3891 | -0.1164 | 0.0603 |
| 11 | 0.0707 | -0.1555 | 0.8101 | 0.4311 | -0.1257 | 0.0644 |
| 12 | 0.0732 | -0.1589 | 0.7784 | 0.4730 | -0.1341 | 0.0680 |
| 13 | 0.0751 | -0.1608 | 0.7448 | 0.5145 | -0.1415 | 0.0710 |
| 14 | 0.0761 | -0.1611 | 0.7096 | 0.5554 | -0.1480 | 0.0734 |
| 15 | 0.0765 | -0.1598 | 0.6728 | 0.5956 | -0.1532 | 0.0751 |
| 16 | 0.0761 | -0.1572 | 0.6348 | 0.6348 | -0.1572 | 0.0761 |
| 17 | 0.0751 | -0.1532 | 0.5956 | 0.6728 | -0.1598 | 0.0765 |
| 18 | 0.0734 | -0.1480 | 0.5554 | 0.7096 | -0.1611 | 0.0761 |
| 19 | 0.0710 | -0.1415 | 0.5145 | 0.7448 | -0.1608 | 0.0751 |
| 20 | 0.0680 | -0.1341 | 0.4730 | 0.7784 | -0.1589 | 0.0732 |
| 21 | 0.0644 | -0.1257 | 0.4311 | 0.8101 | -0.1555 | 0.0707 |
| 22 | 0.0603 | -0.1164 | 0.3891 | 0.8398 | -0.1503 | 0.0674 |
| 23 | 0.0556 | -0.1063 | 0.3471 | 0.8674 | -0.1434 | 0.0634 |
| 24 | 0.0506 | -0.0957 | 0.3052 | 0.8926 | -0.1348 | 0.0587 |
| 25 | 0.0451 | -0.0844 | 0.2638 | 0.9155 | -0.1243 | 0.0533 |
| 26 | 0.0393 | -0.0728 | 0.2230 | 0.9359 | -0.1120 | 0.0473 |
| 27 | 0.0331 | -0.0608 | 0.1829 | 0.9536 | -0.0979 | 0.0407 |
| 28 | 0.0268 | -0.0487 | 0.1438 | 0.9686 | -0.0819 | 0.0335 |
| 29 | 0.0202 | -0.0364 | 0.1058 | 0.9808 | -0.0641 | 0.0258 |
| 30 | 0.0135 | -0.0241 | 0.0690 | 0.9901 | -0.0445 | 0.0176 |
| 31 | 0.0068 | -0.0120 | 0.0337 | 0.9965 | -0.0231 | 0.0090 |

Figure 6:
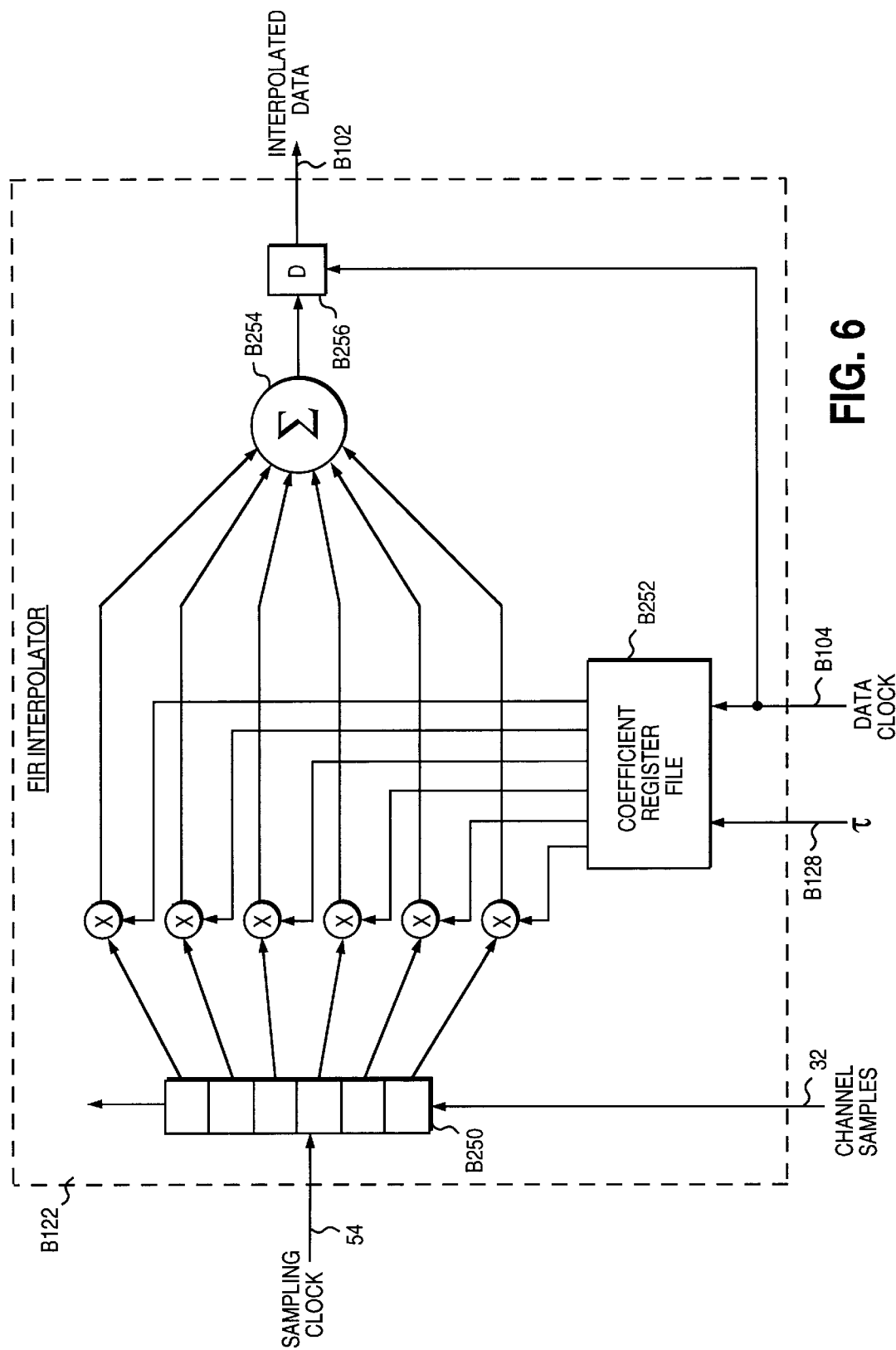
FIG. 6 shows an FIR filter for implementing the timing recovery interpolation filter of the present invention.

Table 2 shows example coefficients $C_\tau(n)$ calculated from equation (15) with 2R=6, $\alpha$=0.8 and $X(e^{j\omega})$=PR4. The implementation of the six tap FIR filter is shown in FIG. 6. A shift register B250 receives the channel samples 32 at the sampling clock rate 54. The filter coefficients $c_\tau(n)$ are stored in a coefficient register file B252 and applied to corresponding multipliers according to the current value of $\tau$ B128. The coefficients are multiplied by the channel samples 32 stored in the shift register B250. The resulting products are summed B254 and the sum stored in a delay register B256. The coefficient register file B252 and the delay register B256 are clocked by the data clock B104 to implement the masking function described above.

In an alternative embodiment not shown, a plurality of static FIR filters, having coefficients that correspond to the different values of $\tau$, filter the sample values in the shift register B250. Each filter outputs an interpolation value, and the current value of the interpolation interval $\tau$ B128 selects the output of the corresponding filter as the output B102 of the interpolator B122. Since the coefficients of one filter are not constantly updated as in FIG. 6, this multiple filter embodiment increases the speed of the interpolator B122 and the overall throughput of the read channel.

Sub-sampled Read Channel

In the discussion above, the interpolated timing recovery of FIG. 4B was described as an over-sampled system; that is, the analog read signal 62 is sampled 24 slightly above the baud rate and then "down-sampled" (interpolated B122) to generate sample values B102 synchronized to the baud rate. It is possible, however, to significantly under-sample the analog read signal and then "up-sample" to generate the synchronous samples. This is accomplished by sampling 24 at a rate significantly below the baud rate (e.g., ⅔ the baud rate) and then interpolating B122 to the baud rate sample values using the interpolated timing recovery circuit of FIG.

4B. Sub-sampling and interpolation alleviates the speed constraint of the A/D and obviates the timing recovery VCO B164 of FIG. 4A, thereby increasing the overall throughput of the read channel.

Figure 7A:
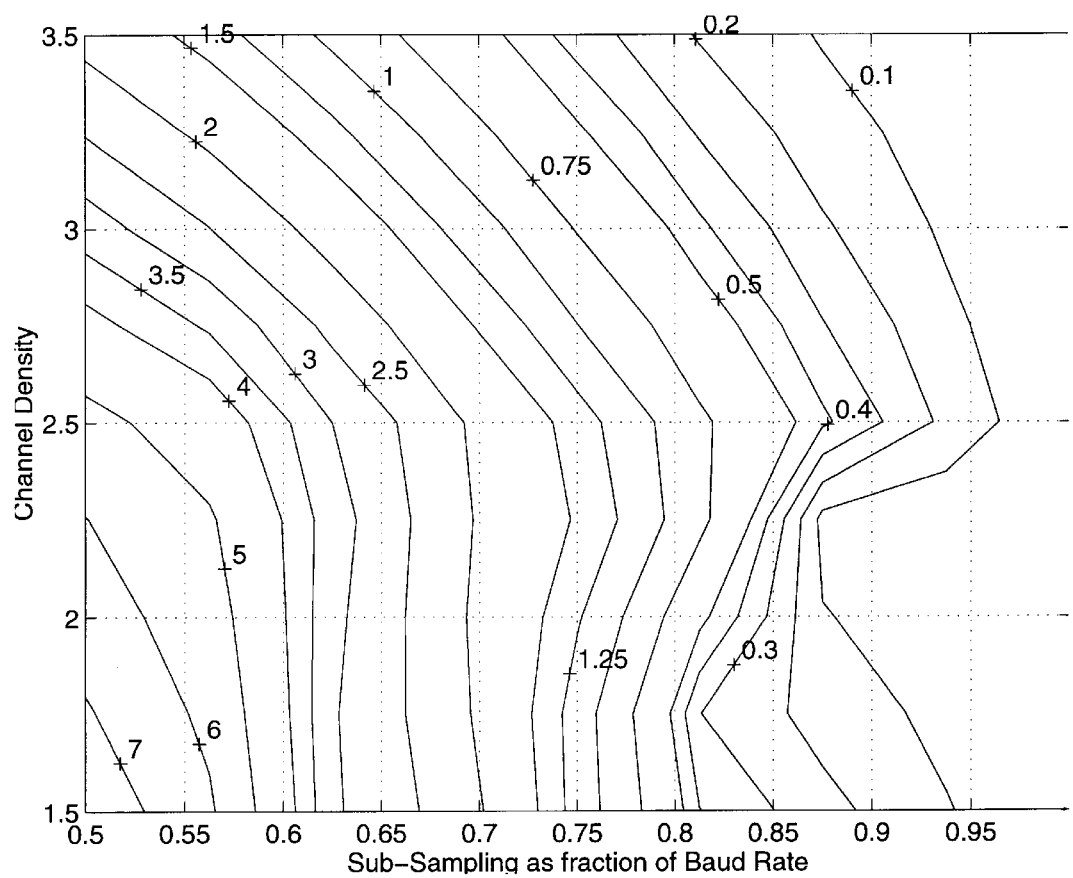
FIG. 7A is a contour plot of the dB loss in performance due to sub-sampling the read signal in an uncoded read channel.

Computer simulations were carried out to determine the extent that sub-sampling degrades the performance of the read channel. First, the sub-sampled read channel was simulated as an uncoded system (d=0), the results of which are shown in FIG. 7A. This graph is a contour plot of the distance loss in dB (performance loss) caused by sub-sampling (decrease in bandwidth as a fraction of the baud rate) for various channel densities (number of channel bits in an interval equal to ½ p(t), where p(t) is the response of the recording head to an isolated medium transition). As shown in FIG. 7A, an uncoded read channel operating at a sub-sampled rate quickly loses performance, especially at lower channel densities, as the amount of sub-sampling increases.

Figure 7B:
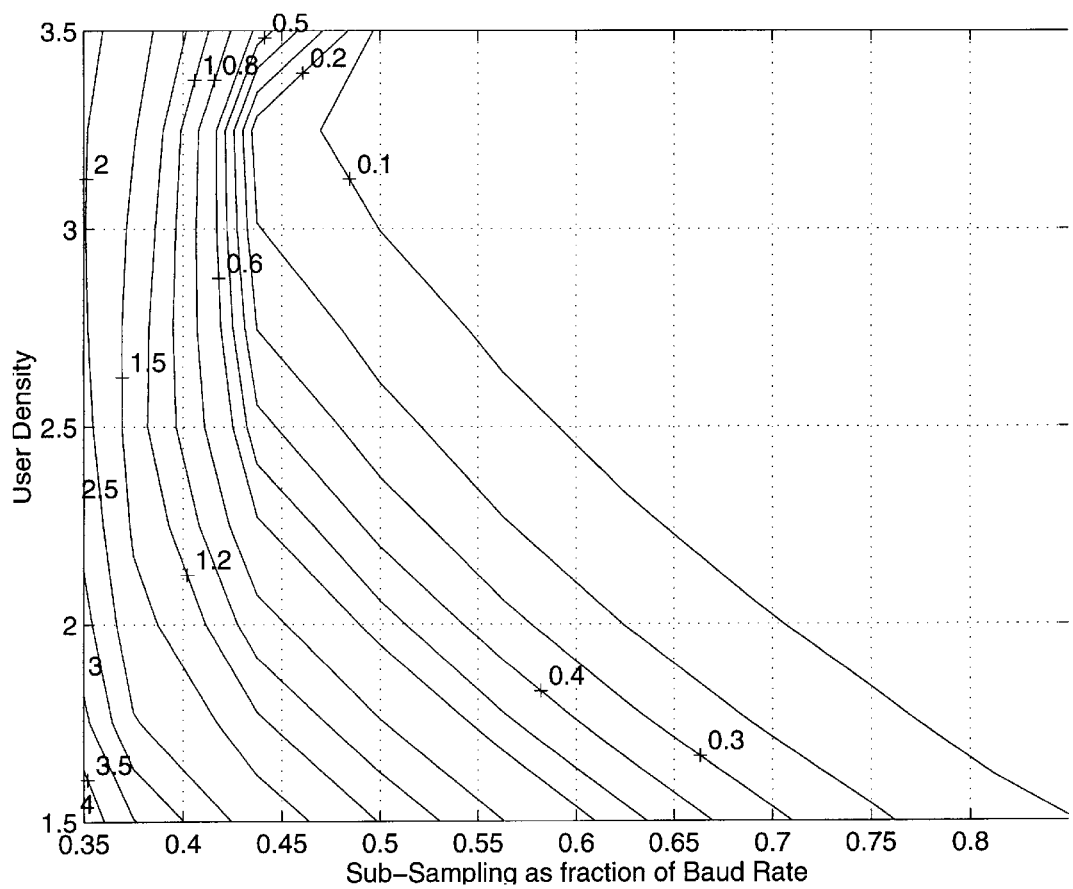
FIG. 7B illustrates the dB loss due to subsampling when employing an RLL d=1 constraint, which also shows the improvement over the uncoded system of FIG. 7A.

The same computer simulations were then carried out after introducing a code constraint which increases the minimum distance error event for a maximum likelihood sequence detector. In particular, a RLL d=1 constraint was introduced, the results of which are shown in FIG. 7B. As illustrated, the d=1 constraint significantly improves performance of the read channel, even at lower user densities (the user density is equal to the channel density multiplied by the code rate). In fact, there is very little performance loss for sub-sampling down to one half the baud rate for user densities above 2.0.

For both the uncoded (d=0) and d=1 code constraint, the simulations were carried out for an optimal MLSD sequence detector which comprises: a filter matched to the pulse shape p(t), a sampler producing $x_{k=}x(kT)$, a noise whitening filter, and a Viterbi (or equivalent) detection algorithm. Thus, the simulation results of FIG. 7A and 7B are a theoretical bound on the best possible performance for varying degrees of sub-sampling. Practical sequence detection methods are approximations of the optimal MLSD-they should degrade similarly as the degree of sub-sampling increases (bandwidth decreases).

Referring again to FIG. 7B, there is very little loss in performance for an optimal MLSD read channel when employing a d=1 code constraint and sub-sampling down to approximately one half the baud rate for moderately high user density. This is very encouraging since it indicates that a more practical read channel will also operate at similar sub-sampled rates without significant loss in performance. Computer simulations of a conventional d=1, rate ⅔, read channel using sub-sampling at ⅔ the baud rate and the above-described interpolated timing recovery verified that this is the case. To implement the ⅔ sampling rate in a conventional d=1 read channel, the frequency synthesizer 52 of FIG. 4B generates two clocks: a first clock for clocking the A/D 24, EPR4 equalizer filter B26, and the interpolator B122 at slightly above ⅔ the baud rate; and a second clock for clocking the data clock AND gate B126 at 3/2 the frequency of the first clock (i.e., at slightly above the baud rate). This is accomplished by dividing a reference clock by 3 and 2, respectively.

Although the d=1 constraint significantly improves the performance of the read channel in the presence of sub-sampling, the overhead in the code rate (rate ⅔) is highly inefficient. Therefore, another aspect of the present invention is to provide an alternative trellis code which provides a similar distance enhancing property as the d=1 constraint, but with a more efficient code rate.

Trellis Coded Modulation

The present invention further includes a trellis code that provides the same distance enhancing property as a conventional RLL d=1 constraint and, moreover, exhibits an improved theoretical capacity of 0.9032. A practical embodiment of a rate ⅚ trellis code according to the present invention is disclosed below; this is a significant improvement over the rate ⅔ conventional RLL (1,7) trellis code. Furthermore, in contrast to the static trellis structure associated with the conventional d=1 code, the trellis code of the present invention is "time varying" meaning that the state transition diagram and corresponding trellis diagram vary with time. It is this time varying characteristic that enables a practical implementation with the improved ⅚ rate. To understand how the trellis code of the present invention provides the same distance enhancing property of a d=1 code, the basic operation of Viterbi detectors for partial response read channels is described.

The output of a partial response read channel is a convolution code generated by convolving the input sequence with the dipulse response of the channel (e.g., a dipulse shown in Table 1); the read channel can therefore be modeled as a finite state machine. With the input symbols a(n) 16 of FIG. 2 taking on the values {+1, −1}, the number of channel states equals $2^n$ where n is one less than the number of sample values in the dipulse response (i.e., n equals the number of unit delays in the transfer function). As described above, the transfer function of a partial response read channel is of the form $$(1-D)(1+D)^N$$

where D is a delay equal to the symbol rate and N=n−1 (in PR4 recording N=1, in EPR4 recording N=2, and in EEPR4 recording N=3). For illustration purposes, consider the transfer function for the PR4 read channel represented by the polynomial $(1-D^2)$. The output of the channel is generated by subtracting from the current input symbol a previous input symbol at time $D^2$. With the input symbols a(n) 16 of FIG. 2 taking on the values in the set {+1, −1}, the output of the channel 32 takes on the values in the set {+2, 0, −2}. The PR4 Viterbi sequence detector 34 operates by examining the channel sample values 32 in context to determine a most likely estimated data sequence associated with the samples.

Figure 8A:
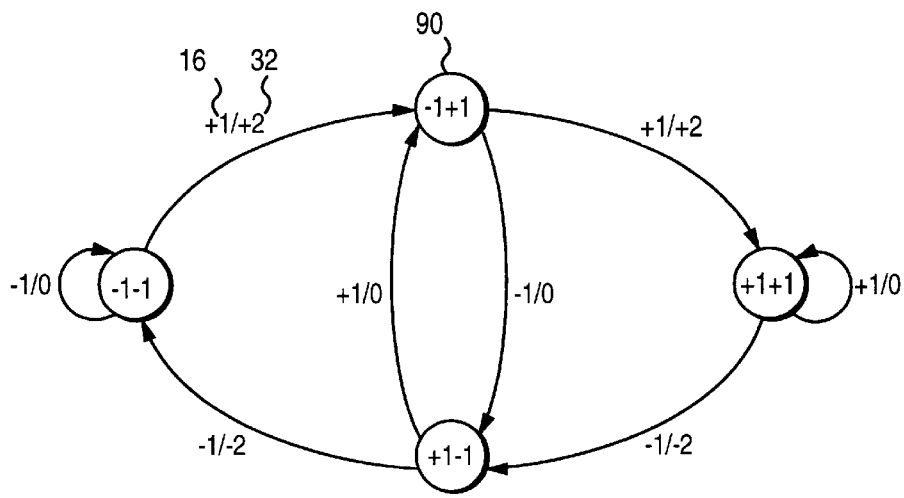
FIG. 8A is a state transition diagram of a conventional PR4 sequence detector.

Operation of a PR4 sequence detector is understood from its state transition diagram shown in FIG. 8A. Each state 90 is represented by the last two input symbols a(n) 16 (after preceding 10), and each branch from one state to another is labeled with the current input symbol a(n) 16 and the corresponding sample value 32 it will produce during read-back. Thus, during readback the sample sequence can be demodulated into the input symbol sequence a(n) (recorded sequence) according to the state transition diagram. However, noise in the read signal—due to timing errors, misequalization, etc.—will obfuscate the readback sample values and introduce ambiguity in the correct demodulated data sequence. The function of the Viterbi detector, then, is to resolve this ambiguity by demodulating the sample values into a most likely data sequence.

Figure 8B:
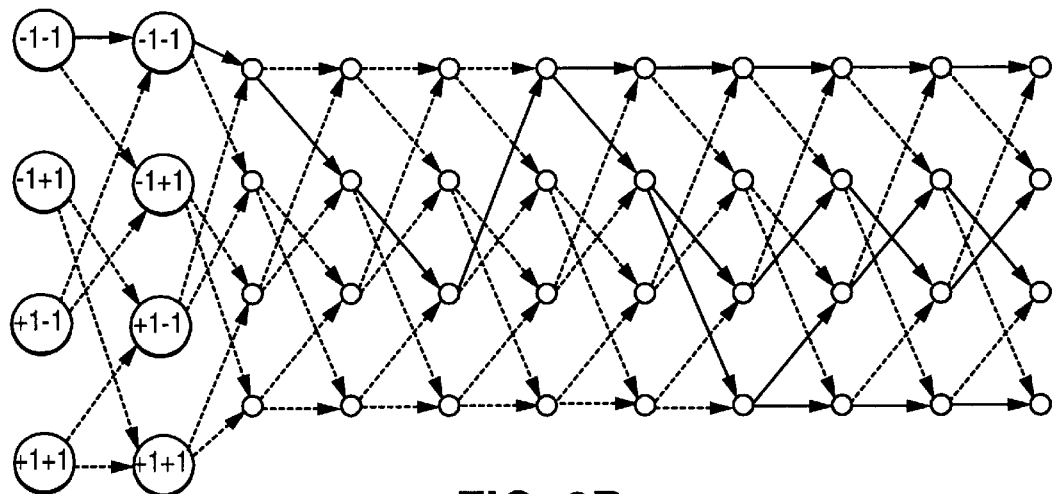
FIG. 8B is a trellis diagram corresponding to the state transition diagram of FIG. 8A.

The demodulation process of the Viterbi detector is understood by representing the state transition diagram of FIG. 8A as a trellis diagram shown in FIG. 8B. The trellis diagram represents a time sequence of sample values and the possible recorded input sequences a(n) that could have produced the sample sequence. For each possible input sequence a(n), an error metric is computed relative to a difference between the sequence of expected sample values that would have been generated in a noiseless system and the actual sample values read from the channel. For instance, a Euclidean metric is computed as the accumulated square difference between the expected and actual sample values. The input sequence a(n) that generates the smallest Euclidean metric is the most likely sequence to have created the actual sample values; this sequence is therefore selected as the output of the Viterbi detector.

To facilitate the demodulation process, the Viterbi sequence detector comprises path memories for storing each of the possible input sequences a(n) and a corresponding metric. A well known property of a Viterbi sequence detector is that the paths storing the possible input sequences will "merge" into a most likely input sequence after a certain number of sample values are processed (as long as the input sequence is appropriately constrained). In fact, the maximum number of path memories required equals the number of states in the Trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 8B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum error metric. In other words, the Viterbi algorithm will select one of the two input branches into each state since only one of the branches will correspond to the minimum error metric. As a result, the paths through the trellis corresponding to the branches not selected will merge into the paths that were selected. Eventually, all of the survivor sequences will merge into one path through the trellis which represents the most likely estimated data sequence to have generated the sample values.

It is possible for the noise to change the sample values enough such that the most likely sequence selected by the Viterbi detector is actually an incorrect sequence. This is similar to the Hamming distance of an error correcting code. That is, a Viterbi sequence detector has associated with it a minimum distance between the possible data sequences and their corresponding sample sequences. Enough noise in the read signal can result in what is referred to as a minium distance error event in the detected data sequence. With respect to the trellis diagram, a minimum distance error event can occur between two paths that diverge from a current state and remerge at a later state.

The length of the minimum distance error events (i.e., number of sample periods through the trellis before merging to a common state) varies. If the noise samples in the read channel are statistically independent and have a Gaussian probability distribution, then the minimum distance error events occur with equal probability, regardless as to the length. However, the noise samples in the read channel are not independent Gaussian because the equalizing filters tend to color or correlate the noise samples. This changes the probability distribution of the minimum distance error events and, in particular, changes the distribution such that the minimum length error events are the most likely to occur.

The recording density can also affect the probability distribution of error events. In an EPR4 read channel, for example, at higher channel densities (e.g., 3 and higher) a phenomenon occurs where non-minimum distance error events become the dominant or most probable error events. The following discussion illustrates how the trellis code of the present invention provides 2.2 dB of coding gain in an EEPR4 read channel by coding out all of the minimum distance error events. However, the trellis code of the present invention also provides coding gain in an EPR4 read channel at higher channel densities by coding out the dominant (as opposed to minimum distance) error events. Thus, the factors that influence the preferred embodiment include the trade-off between complexity and performance (where EEPR4 is generally more complex than EPR4 but provides better performance), as well as the desired channel density (where EPR4 may be preferred at channel densities of 3 and higher).

Figure 9A:
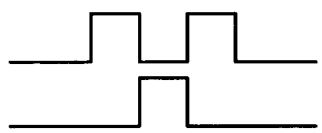
FIG. 9A–9D illustrate the data sequences that result in minimum distance error events in an EEPR4 sequence detector.
Figure 9B:
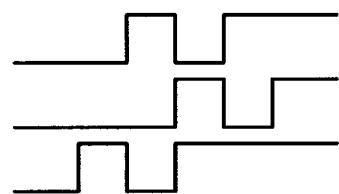
Figure 11:
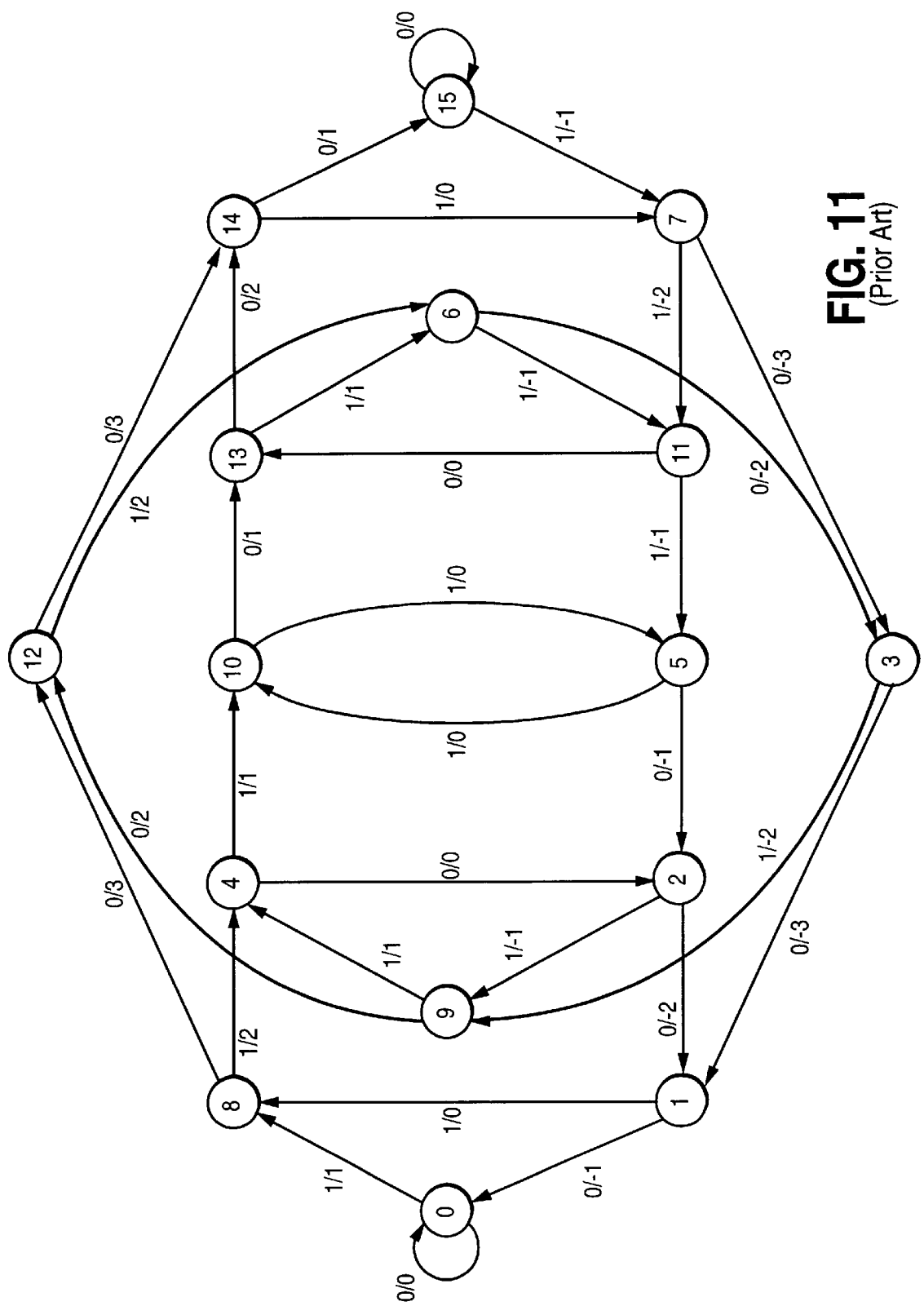
FIG. 11 is a state transition diagram of a conventional (uncoded) EEPR4 sequence detector.

The state transition diagram for an EEPR4 read channel with a transfer function of $(1-D)(1+D)^3$ is shown in FIG. 11. The resulting trellis code has a minimum Euclidean distance of $d_{min}^2=6$. The minimum distance error events occur due to the distance between the following data sequences: a quadbit and a dibit, as shown in FIG. 9A; and tribit sequences different by a single NRZI shift left or right, as shown in FIG. 9B. The next higher distance error event, $d_{min}^2=8$, occurs due to the distance between the following data sequences: N consecutive NRZI "1" bits and N+2 consecutive NRZI "1" bits where N>2, as shown in FIG. 9C; and M consecutive NRZI "1" bit sequences different by a single NRZI shift left or right, as shown in FIG. 9D.

The present invention increases the minimum distance of the EEPR4 trellis sequence detector to $d_{min}^2=10$ by encoding the user data according to a conventional RLL k constraint (d=0), as well as the following unique constraints:

1. forbidding sequences with runs of four or longer NRZI "1" bits; and
2. restricting the start of tribit sequences (three consecutive NRZI "1" bits) to k-mod-3=p, where k is a bit index of a codeword and p is a constant.

Figure 9C:
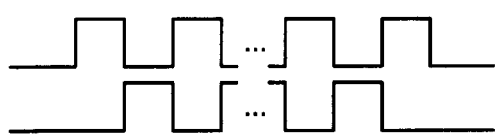
Figure 9D:
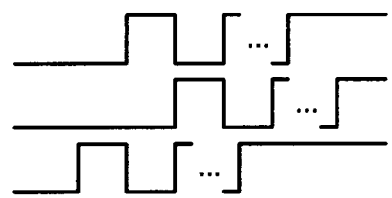

The constraint forbidding sequences with runs of four or longer NRZI "1" bits codes out the quadbit of FIG. 9A (i.e., that $d_{min}^2=6$ error event) as well as all of the data sequences of FIG. 9C and 9D (i.e., all of the data sequences where $d_{min}^2=8$). The constraint restricting the start of tribit sequences to k-mod-3=p codes out the remaining minimum distance error event ($d_{min}^2=6$) of FIG. 9B. Thus, these constraints provide the same distance enhancing property as a conventional RLL d=1 constraint, but as described below, with a more efficient code rate.

Figure 10A:
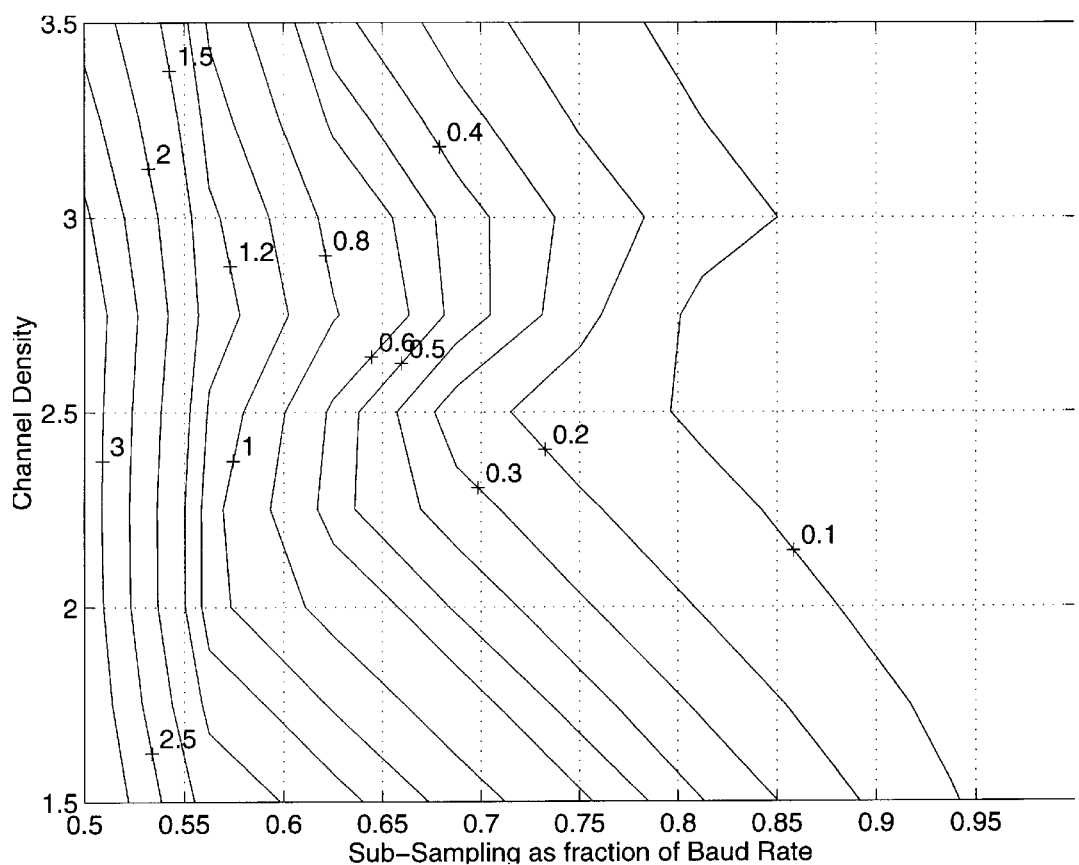
FIG. 10A is a counter plot showing the performance loss (in dB) relative to the degree of sub-sampling and the channel density when employing the k-mod-3=p constraint of the present invention.

The coding gain provided by the above code constraints also enhances the operation of a read channel in the presence of sub-sampling. In other words, the above constraints code out the data sequences most likely to result in an error event when the read signal is sampled significantly below Nyquist (i.e., the baud rate). This is illustrated by the contour plot of FIG. 10A which shows the performance loss (in dB) relative to the degree of sub-sampling and the channel density. Compared with FIG. 7A, the performance enhancing property of the trellis code is apparent; additionally, it provides an improvement over the d=1 constraint of FIG. 7B due to the improved code rate. Similar to FIGS. 7A and 7B, the contour plot of FIG. 10A was generated for a computer simulated maximum likelihood sequence detector (MLSD) described above. However, since practical sequence detectors are an approximation of MLSD, similar results are expected.

Figure 10B:
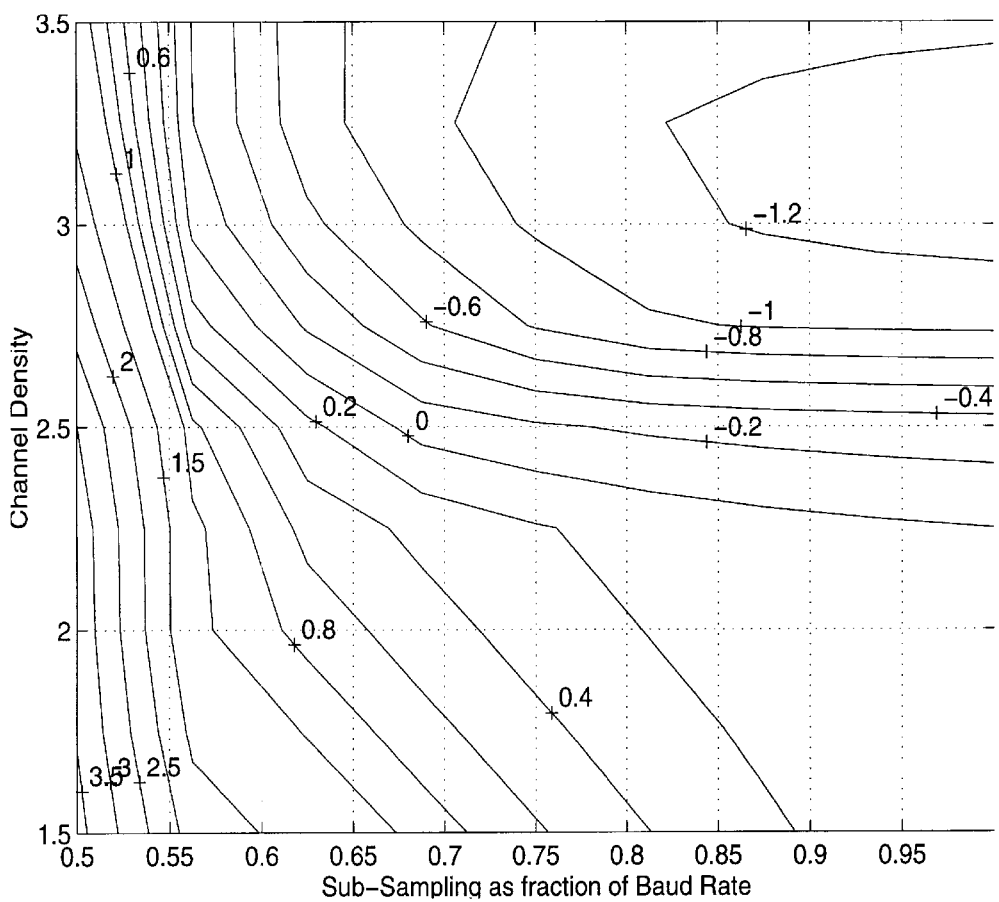
FIG. 10B is a counter plot similar to FIG. 10A, except it illustrates the coding gain (in dB) provided by the k-mod-3=p constraint over an uncoded system relative to the degree of sub-sampling and the channel density.

FIG. 10B is yet another contour plot showing the performance loss (in dB) relative to the degree of sub-sampling and channel density when the above code constraints are implemented. This plot differs from FIG. 10A in that the dB coding gain (or loss) is shown relative to an uncoded MLSD system. For example, when not sub-sampling (sampling at Nyquist) at a channel density of approximately 3, the trellis code of the present invention provides 1.2 dB of coding gain over an uncoded system. As the degree of sub-sampling increases, the coding gain slowly dissipates; however, even when sub-sampling at ⅔ Nyquist, the trellis code still provides approximately 0.8 dB in coding gain for channel densities greater than 3. As disc recording devices move toward channel densities above 3, practical application of the present invention to an EPR4 read channel becomes more likely.

Figure 12A:
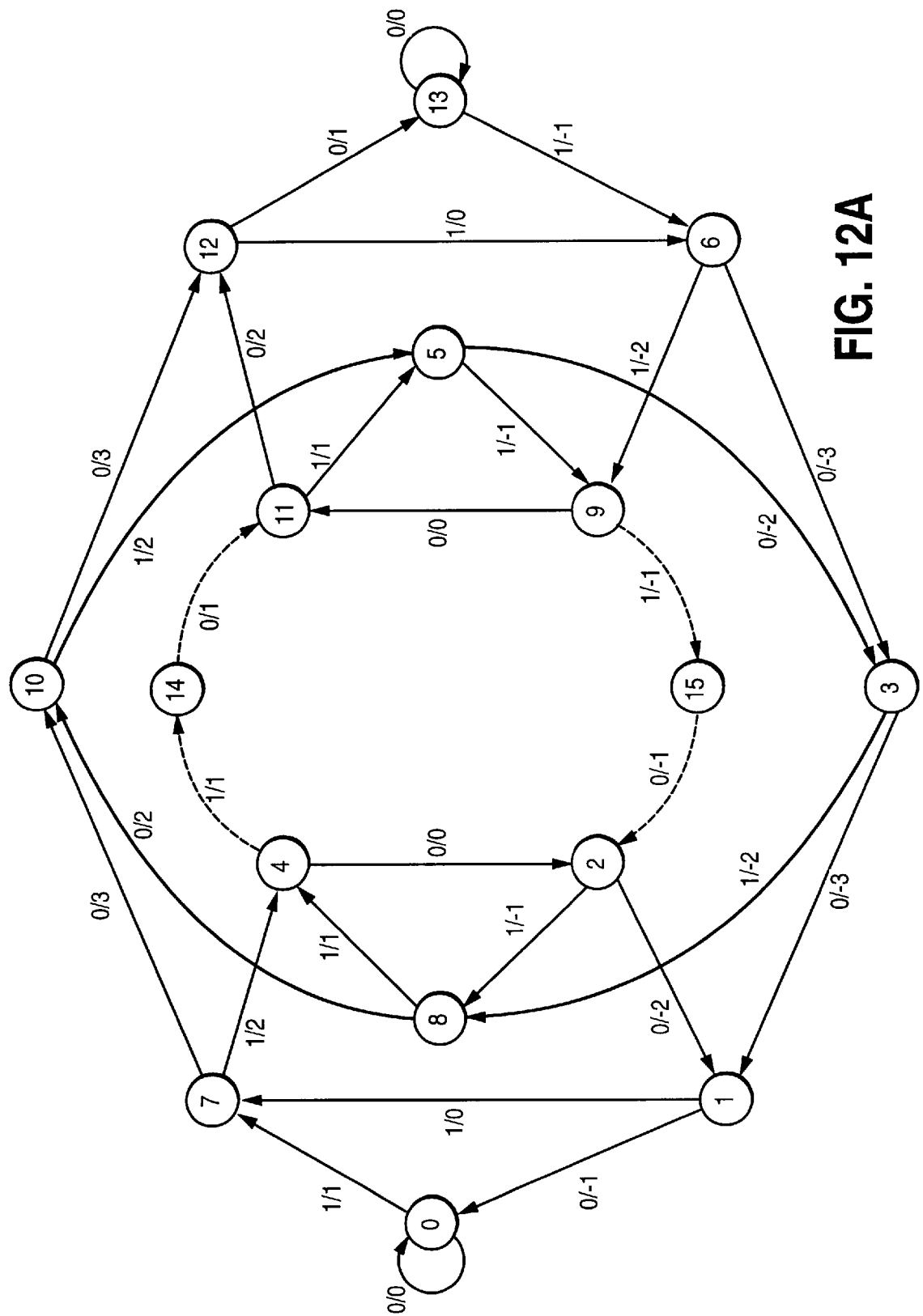
FIG. 12A is a time varying state transition diagram for an EEPR4 time varying sequence detector that implements the trellis modulation coding constraints of the present invention.

The above code constraints of the present invention are implemented by the trellis encoder B6, trellis decoder B36, and the time varying sequence detector B34 of FIG. 3. Realizing the coding gain requires that the time varying sequence detector be "matched" to the code constraints. FIG. 11 shows the state transition diagram of a conventional EEPR4 sequence detector for detecting uncoded data in contrast to the state transition diagram for an EEPR4 detector of the present invention which is shown in FIG. 12A. To implement the above first code constraint, states {14,15} in FIG. 12A exist only at times k-mod-3=p as indicated by the dashed lines (transition branches). In other words, the state transition diagram of FIG. 12A is time varying. Also notice that the transition diagram implements the above second code constraint of the present invention—it forbids runs of four or longer NRZI "1" bits.

Figure 12B:
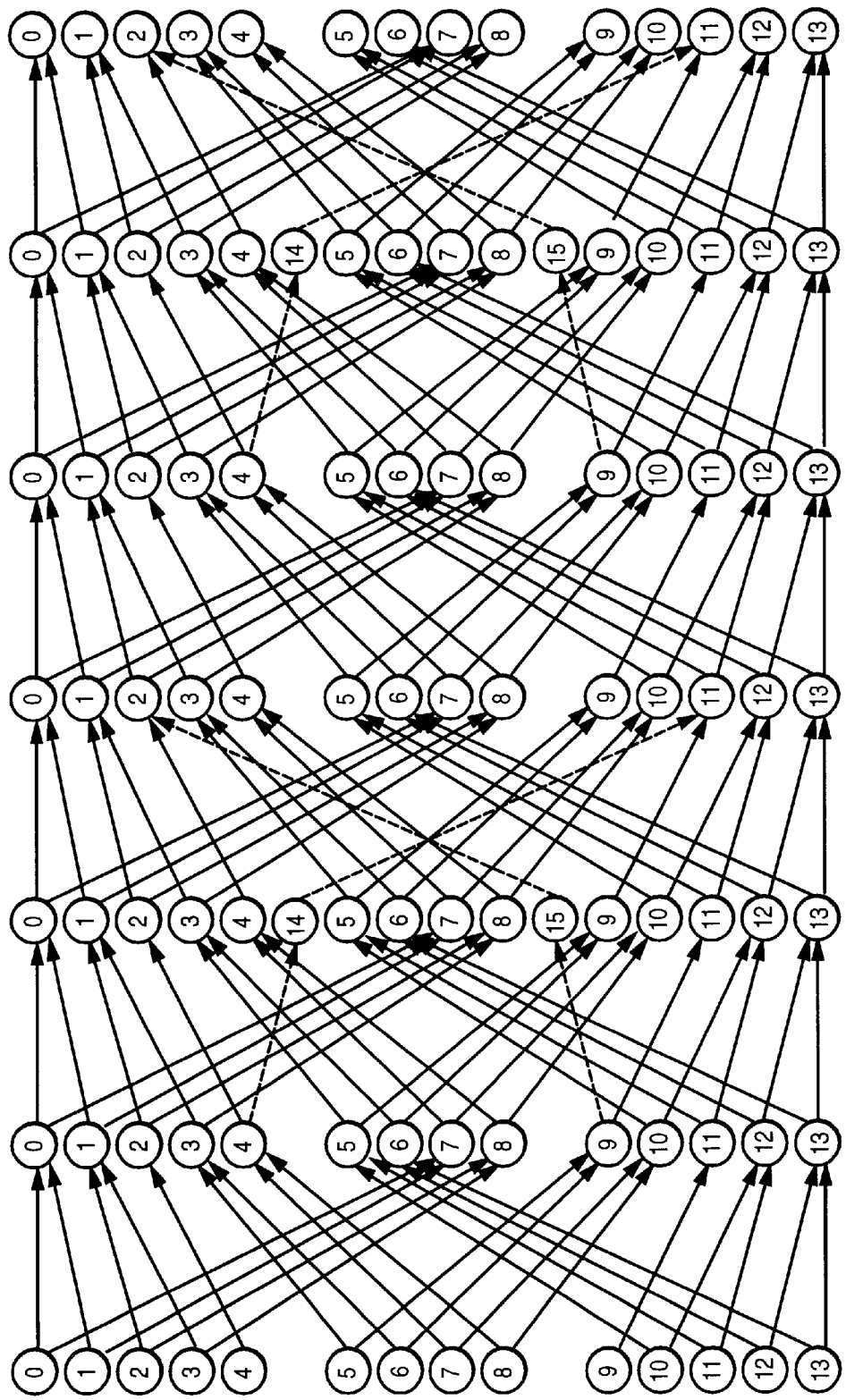
FIG. 12B is a time varying trellis diagram corresponding to the state transition diagram of FIG. 12A.

The trellis diagram corresponding to the state transition diagram of FIG. 12A is shown in FIG. 12B. This figure better illustrates the time varying property of the sequence detector. Notice that states {14,15} and their respective transition branches exist only at time indices of k-mod-3=p in order to code out the error events described above. It is within the ability of one skilled in the art to implement a time varying sequence detector that operates according to the EEPR4 trellis diagram of FIG. 12B.

It has also been determined, through computer simulations, that the trellis code of the present invention provides coding gain when applied to an EPR4 sequence detector at high channel densities (e.g., 3 and higher). Although the above code constraints do not code out the minimum distance error events in the EPR4 space, at higher channel densities (e.g., 3 and higher) the dominant error events are non-minimum distance error events associated with the data sequences shown in FIG. 9A and 9B, which are coded out by the code constraints of the present invention as described above.

Figure 13:
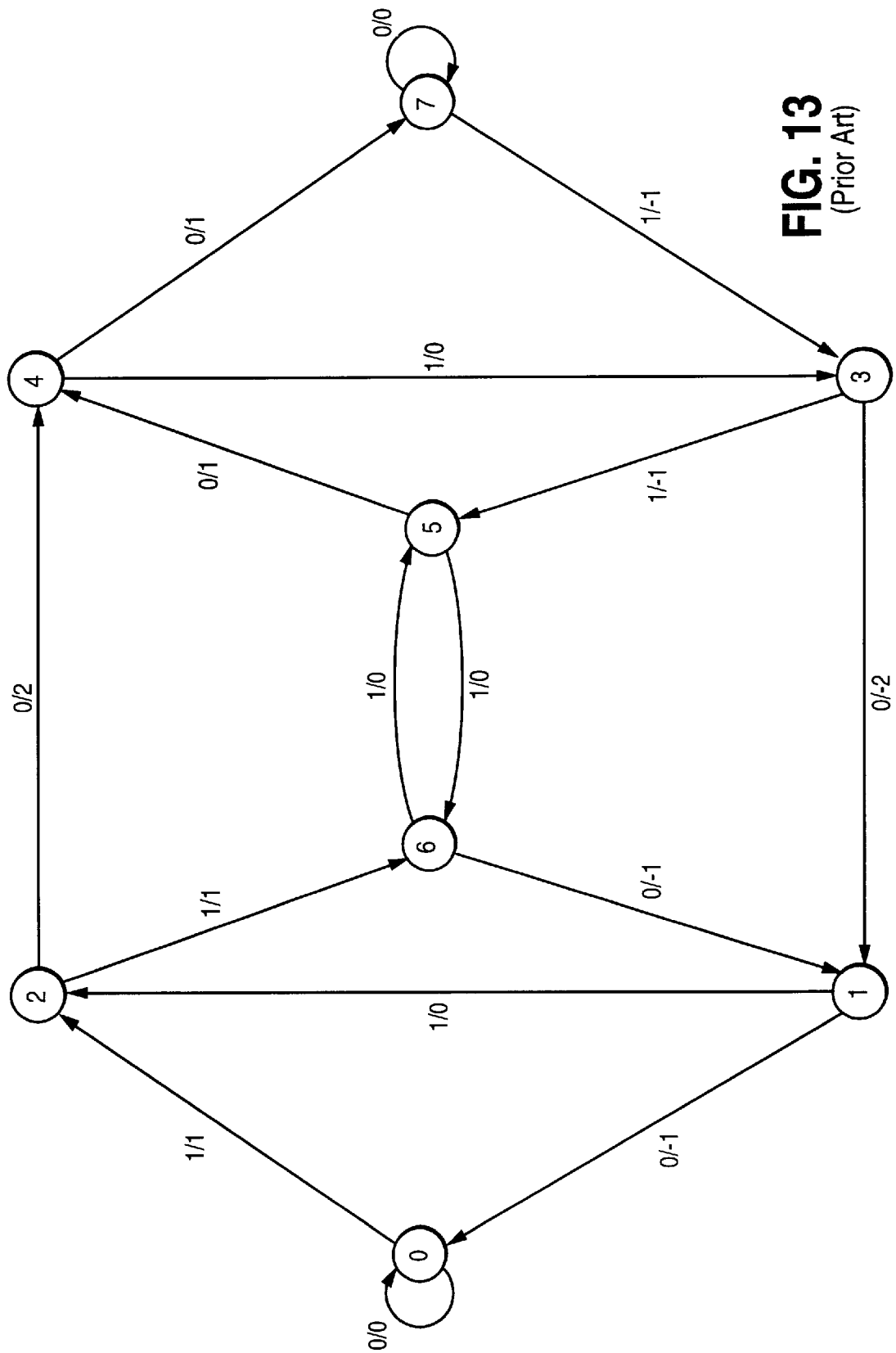
FIG. 13 is a state transition diagram of a conventional (uncoded) EPR4 sequence detector.
Figure 14A:
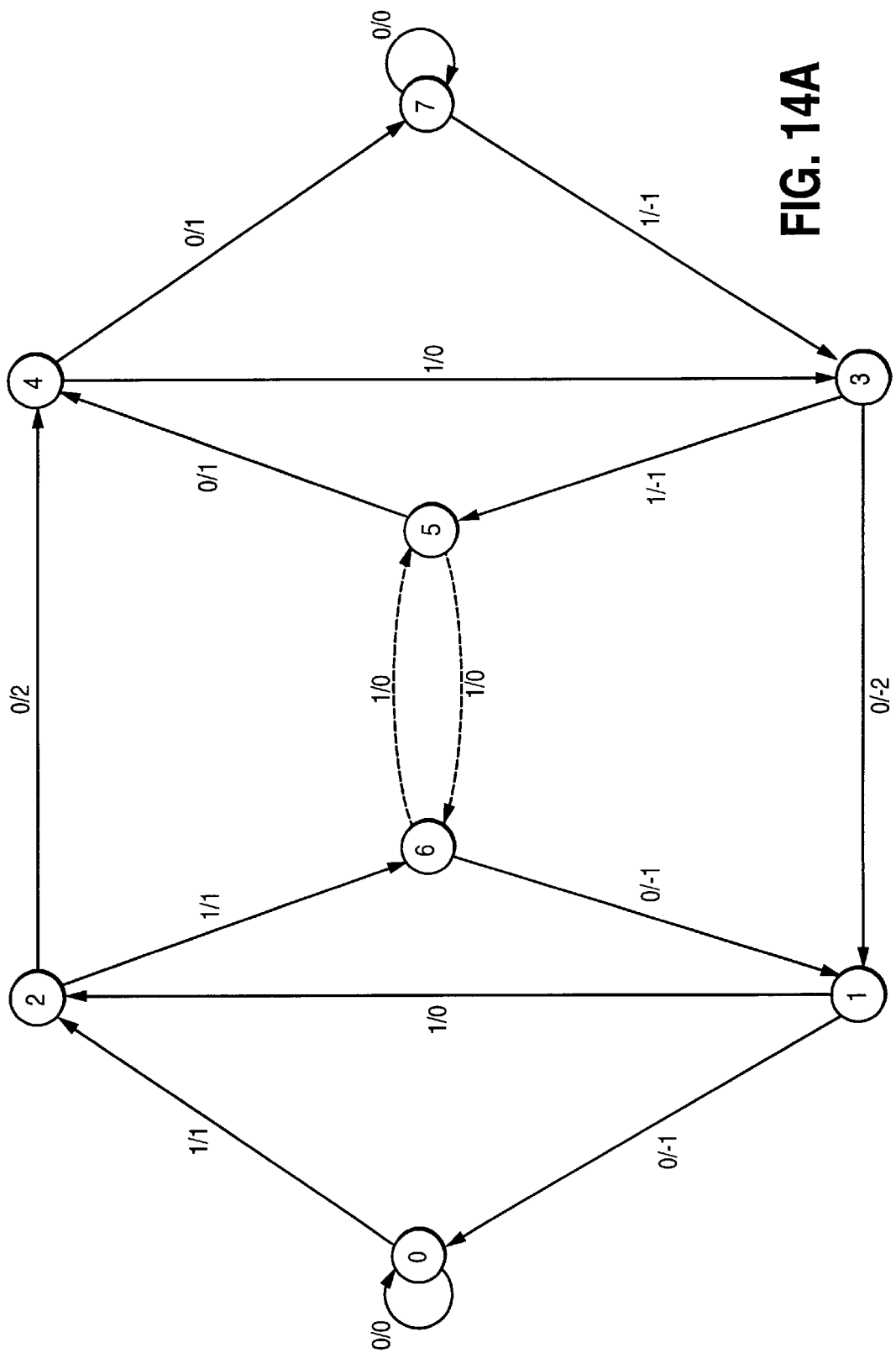
FIG. 14A is a time varying state transition diagram for an EPR4 time varying sequence detector that implements the trellis modulation coding constraints of the present invention.
Figure 14B:
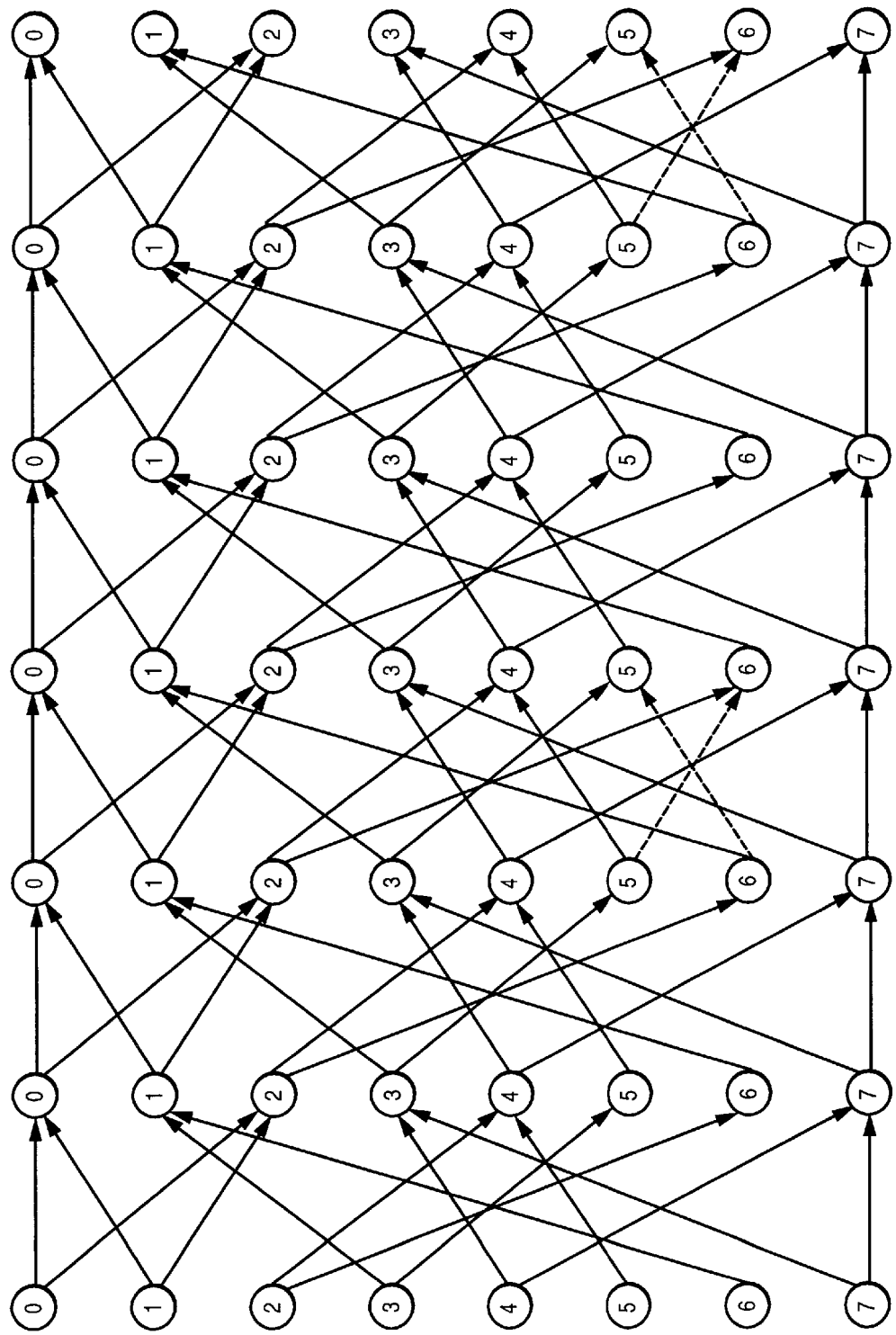
FIG. 14B is a time varying trellis diagram corresponding to the state transition diagram of FIG. 14A.

The state transition diagram of a conventional EPR4 sequence detector is shown in FIG. 13, and the state transition diagram after being modified according to the code constraints of the present invention is shown in FIG. 14A. The transition diagram of FIG. 14A is also time varying due to states {5,6} existing only at times k-mod-3=p. Also notice that the diagram has been modified to implement the other constraint of the present invention—forbidding runs of four or longer NRZI "1" bits. The corresponding time varying trellis diagram for the EPR4 sequence detector of the present invention is shown in FIG. 14B, where states {5,6} and their respective transition branches exist only at time indices of k-mod-3=p. It is within the ability of one skilled in the art to implement a time varying sequence detector that operates according to the EPR4 trellis diagram of FIG. 14B.

Trellis Encoder/Decoder

Figure 15A:
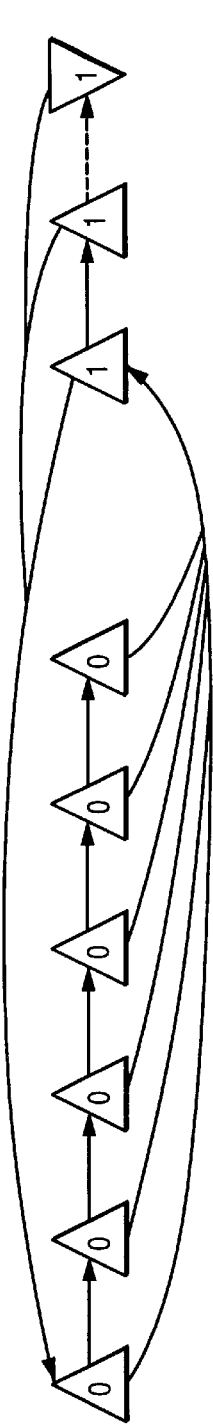
FIG. 15A is a time varying state transition diagram that embodies the k-mod-3=p constraint with an RLL (d,k) constraint of k=5.

The above constraints for implementing the trellis coded modulation of the present invention are implemented by the trellis encoder B6 and decoder B36 of FIG. 3. An example time varying state transition diagram that embodies the constraints of the present invention with an RLL k constraint of k=6 is shown in FIG. 15A. Branches leading to states labeled "1" represent NRZI "1" bits in a codeword. The dashed branch of FIG. 15A exists only when k-mod-3=2 to satisfy the above first constraint. The theoretical capacity of 0.9032 for this code (i.e., for k->∞) is found by constructing the steady-state transition diagram of FIG. 15B, which is a cross product of the diagram of FIG. 15A with three time slots modulo 3.

Figure 15B:
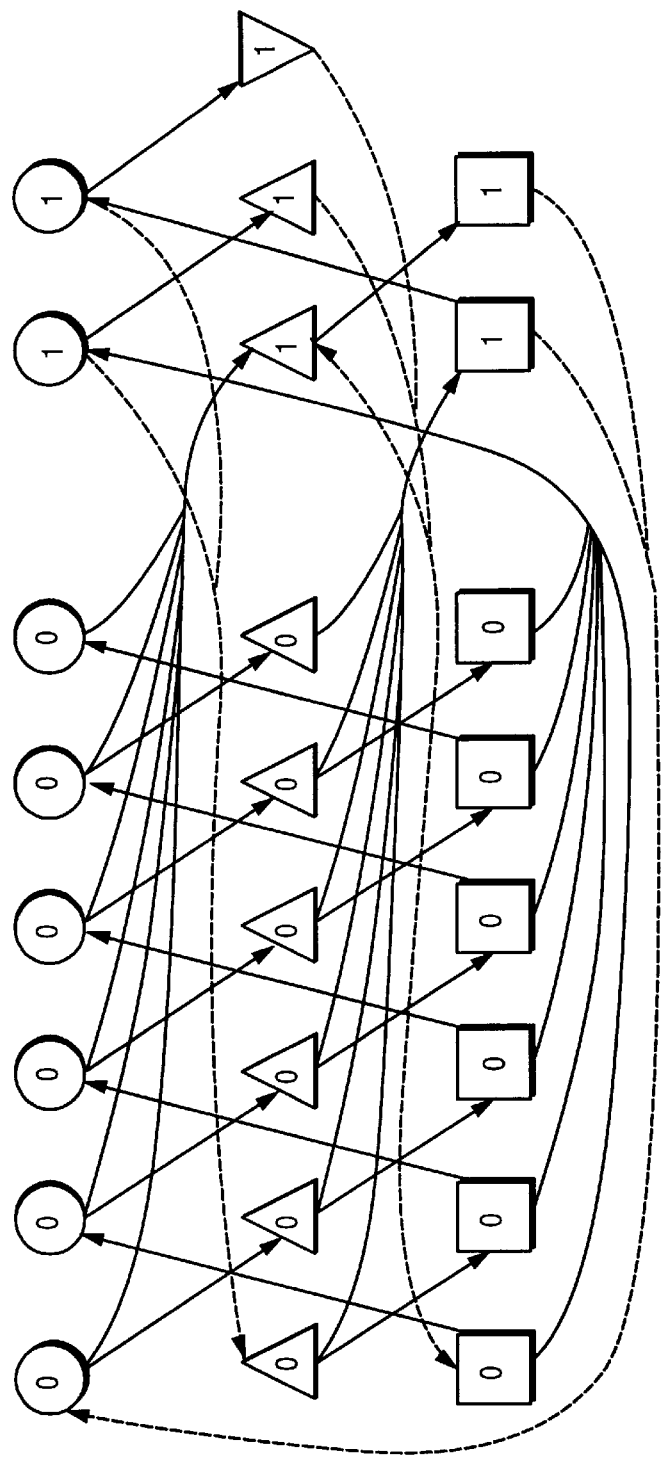
FIG. 15B is a steady state trainsition diagram created as a cross product of the diagram of FIG. 15A with three time slots modulo 3.

This section describes a procedure to generate block codes according to the state transition diagrams shown in FIG. 15A and 15B with rates up to and including 9/10 that exhibit the k-mod-3=p constraint of the present invention. In addition, the procedure of the present invention enables a cost effective implementation of the encoder/decoder hardware.

In a "Simple Block Code", the input data stream is partitioned into blocks of M data bits where each input block is mapped into N encoded bits of a code word (where N>M) according to a static (time invariant) map. Conceptually, the encoder can be implemented as a lookup table addressed by the $2^M$ input words of M bits and outputting a corresponding output code word comprising N bits. Conversely, the decoder can be implemented with an inverse lookup table addressed by the $2^N$ code words of N bits and outputting a corresponding output word comprising M bits. Since N>M, the encoder/decoder has inherent error correction properties; that is, during the decoding process, invalid input code words (detected code words) are mapped using the nearest (in Hamming distance) valid input code word.

Denoting the bits of an encoded code word as {0 1 2 ... N-1}, a simple block code satisfying the k-mod-3=p constraint of the present invention can be constructed according to the following rules:
1) generate a list of $2^N$ code words of length N;
2) delete the code words which end with {1 1}, i.e., positions N-2 and N-1;
3) delete code words which begin with {1 1 1}, i.e., in positions 0 1 and 2.
4) delete code words with tribits beginning in position p where p-Mod-3=0, i.e., code words where a tribit starts in position 0, 3, 6, 9, etc.;
5) delete code words with tribits beginning in position p where p-Mod-3=1, i.e., code words where a tribit starts in position 1, 4, 7, 10, etc.; and
6) delete the all zero code word since it provides no timing information and because it allows quasi-catastrophic error events, which will be discussed below.

Clearly, the above construction rules are sufficient to achieve squared distance 10 on the EEPR4 channel. The number of available code words for various block codes of length N is shown in Table 3:

TABLE 3

| N | Available Words |
|---|---|
| 3 | 5 |
| 4 | 10 |
| 5 | 19 |
| 6 | 38 |
| 7 | 71 |
| 8 | 130 |
| 9 | 254 |
| 10 | 470 |
| 15 | 10,910 |
| 18 | 71,372 |
| 48 | 1.024e13 |
| 60 | 1.875e16 |

Notice that for N<=8, there exist >=$2^{N-1}$ available code words, i.e., enough to create rate (N-1)/N block codes. Of special practical interest, the N=18 block has enough words for rate 16/18=8/9, and a practical factorization for this case is described below. Also of interest, block size N=48 has enough words for rate 43/48, and block size N=60 can achieve rate 9/10. The last two steps of the simple block code construction are:

7) select a mapping between the $2^M$ input code words to the available output code words so as to maximize some user defined function(s), for example, minimum k constraint over all pairs of selected code words, best average timing information, maximum minimum timing information, etc.; and 8) pick a data to codeword mapping that minimizes implementation cost, minimizes error propagation, etc.

Notice that the class of block codes defined above effectively resets the position counter at the beginning of each block. Thus, codes where N is a multiple of 3 generally come closer to the theoretical capacity than codes when N is not a multiple of 3. It is proposed that if N is not a multiple of 3, then a time varying block code can add incremental rate by using 3 independent mappings for each of the 3 phases of the codeword boundaries with respect to absolute time k-Mod-3.

Another design consideration in constructing the block code is to eliminate quasi-catastrophic (QC) error events, that is, semi-infinite error events that have some initial distance from the beginning of the error event that is less than the theoretical $d_{min}$ of the system, but which then add zero incremental distance until the end of the event which is indeterminate in length. Coding out QC error events reduces the necessary length of the path memories of the Viterbi sequence detector. QC error events manifest due to the spectral nulls at DC and Nyquist of the traditional partial response targets. The QC error events occur due to ambiguities between DC and Nyquist energy signals, and due to phase ambiguities at Nyquist.

Those skilled in the art understand that a DFE based detector, namely DFE, FDTS/DFE, RAM-DFE, Viterbi with local feedback, and RAM-RSE, all can in theory have a finite (but small) response at Nyquist. These detectors attempt to effectively truncate the time response of a dibit by feeding back (assumed correct) prior decisions to cancel a portion of the dibit tail. When the feed back decisions are correct, the effective spectrum at the "truncated dibit" is generally changed. And most important for this discussion, the spectrum at Nyquist can increase significantly. Therefore, the error events caused by phase ambiguity at Nyquist are not necessarily QC error events since significant distance (greater than $d_{min}$) can exist, assuming correct prior decisions. However, QC like error events with DFE systems can have semi-infinite error propagation once a feed-back error is made. Therefore, the decision to code out certain potential QC error events is a function of the type of detector employed and the required error propagation control required. Another consideration is that a DFE based system still needs certain minimum timing information, which will limit the length and type of tolerable QC like error events. In the remainder of this disclosure, the block codes are derived assuming general partial response targets with spectral nulls at DC and Nyquist; only true QC error events will be considered.

The simplest QC error event occurs due to aliasing between DC and Nyquist. The run of all adjacent transitions (all Nyquist) is aliased with no transitions, and is described in NRZI notation as event (A):

| |
|---|
| (A) DC vs Nyquist run (in NRZI)<br>0000000 . . . vs<br>1111111 . . . |

More complex QC error evens are illustrated below. They all have the property of confusing bursts of Nyquist runs with bursts of no transitions:

| |
|---|
| (B) 1T-3T vs. 3T-1T.<br>1100110011 . . . vs<br>1011001100 . . .<br>(C) 1T-5T vs. 3T-1T-1T-1T.<br>11000011000011 . . . vs<br>10111100111100 . . .<br>(D) 1T-7T vs. 3T-1T-1T-1T-1T-1T.<br>110000001100000011000000011 . . . vs<br>1011111100111111001111100 . . .<br>(E) 1T-1T-1T-5T vs. 5T-1T-1T-1T<br>11110000111100001111 . . . vs<br>10001111000011110000 |

For the k-mod-3=p constraint of the present invention, only the aliasing in (B) is possible, as all the other cases have one of the pairs violating the code constraint due to a quadbit or longer run. Thus, if the detector is matched to the k-mod-3=p constraint as described above, only the patterns in (B) need be coded out.

Consider, for example, the 6/7 rate block code of block size N=7. The NRZI data sequences in (B), which can be concatenated with any legal previous codeword, will occur due to the following four code words:

| | |
|---|---|
| 1100110 | W1odd |
| 0110011 | W2odd |
| 1001100 | W3odd |
| 0011001 | W4odd |

The only sustainable QC error event occurs due to the sequence of words { . . . , W1,W2,W4,W3,W1,W2 . . . ], but the W2 code word violates the ending constraint and has already been coded out. Thus, all QC error events are coded out. This result holds whenever the block size N is an odd number.

Next consider a 7/8 rate block code of block size N=8. The NRZI data sequences in (B) will occur due to the following four code words:

| | |
|---|---|
| 11001100 | W1even |
| 01100110 | W2even |
| 10011001 | W3even |
| 00110011 | W4even |

The W4 code word violates the ending constraint and is coded out. But three other QC cases exist, namely, repeating either W1 or W2 or W3. Thus, to code out all QC error events, all three code words must be dropped. A similar result exists for the case where N/2 equals an odd number, except only one of the W2 or W3 code words need to be coded out.

Notice that the QC error events discussed above correspond to a detector matched to the k-mod-3=p constraint. In some cases, a significant advantage can be realized even when the sequence detector is not matched to the k-mod-3=p constraint. In that event, it may be advantageous to code out QC error events for the unmatched detector.

Table 3 above shows that interesting block codes of block length N=18, 48, and 60 that satisfy the k-mod-3=p constraint exist. However, these blocks are too long to implement with lookup tables (it requires a table size of $2^N$). Thus, another aspect of the present invention is to provide an economic implementation for both the encoder and decoder that use logical operations to reduce and/or eliminate the use of large tables. There are many possibilities—one such technique is described below.

A practical technique exists for implementing a rate (N−2)/N code for large N=2P which satisfies the k-mod-3=p constraint. In particular, the preferred embodiment for N=18 is considered. The long blocks of N=18 will be factored as two sub-blocks of P=9=N/2. The constructive technique for simple block codes described above achieves 254 suitable code words of length 9 which can be arbitrarily concatenated and still meet the k-mod-3=p constraint. If 2 more code words were available, then an 8/9 simple block code without QC error events would exist. The constructive technique presented to achieve a simple 16/18 block code is based on using an almost 8/9 rate technique the majority of the time, and handling the exceptions otherwise.

Denote the 16 bit input data word as two bytes D1 and D2. Denote the resultant 18 bit encoded code word as two 9-bit symbols C1 and C2. The code construction strategy is to create two types of code words. The first type picks both C1 and C2 from the same basic almost 8/9 rate list of length P=9 code words, i.e., they obey all the N=9 block code constraints. Denote the set of all such P=9 bit words as G. The second type of code word is denoted {E,S}, where both S and E are of length P=9, but all words in E must violate the ending constraint, i.e., E must end in {011}. All words in E must also meet all other k-mod-3=p constraints. In order that the codeword {E,S} not violate the k-mod-3=p constraint, all words in S must start with {0} and must meet all other requirements of the length N=9 block code. Thus S is a subset of G, while E and G are mutually exclusive. Denote the cardinalities of G, S, and E as |G|, |S|, and |E|, respectively. The total number of code words available between {G1,G2} and {E,S} is then simply $|G|^2+|S|*|E|$. It is clear that the union of possible code words {G1,G2} and {E,S} in fact includes every possible code word of length N=2P that meet the length N k-mod-3=p constraints. However, the code is selected so as not to allow the all zero word in any sub-block of length P=9. This will limit the k constraint of the code (the maximum run of NRZI 0's) to 2*P−2=16 in this example. If a sufficient number of code words exist, then the details of a particular mapping (realization) can be started. Excess code words can be used to simplify encode and decode functions, minimize error propagation on decode, improve timing recovery, etc. In this example, a simple mapping is demonstrated that minimizes error propagation.

A simple 16/18 code is disclosed that has a simple encoder and decoder, and low error propagation. A simple search shows that for P=9, |G|=254, |E|=46, and |S|=137 (where the all zero word has been excluded from all sets). So the number of possible code words is 70,818, which far exceeds the $2^{16}$=65,536 required to generate a 16/18 rate code.

Since words of length P=9 are concatenated, there are no QC error events when the words are chosen from G because the word W2=100110011 is not in G. However W2 is in E, so either W2 is dropped from E, or alternatively, word W1=001100110 is dropped from S. For the latter, the effective cardinality of S is reduced by one to 136.

By choosing |G| as large as possible, most of the data bytes are mapped to the 9-bit words in G. Thus, small errors occurring in a word from G are confined to one decoded byte. The probability of not using the mapping {G1,G2} is:

Prob({E,S} Map)=1−(254/256)$^2$=0.0156, i.e. only 1.56% of the time. When the {E,S} map is used it is generally difficult to prevent even small errors from propagating and causing errors in both data bytes D1 and D2. This is undesirable because when two consecutive N=18-bit words are mapped with {E,S}, then a two-bit error that spans the two words can result in four data bytes in error. Modern disk drives most commonly use Reed-Solomon Error Correcting Codes (R-S ECC) with 8-bit symbols and three way interleaving. Thus, when decoded errors span four bytes they cause two errors in one of the R-S interleaves. To avoid this undesirable effect, error propagation to three decoded data bytes are tolerated occasionally, but propagation to four bytes are suppressed as much as practically possible.

Notice that the probability of two consecutive {E,S} mappings is 0.0156$^2$=0.000242=0.0242%. Also notice that only 2*(256−254)*254+(256−254)$^2$=1028 words of {E,S} are needed, while even with the QC restricted S there exist 46*136=6256 words to chose from. Thus, given this surfeit of code words, there are likely many mappings that minimize error propagation. The strategy chosen here will be to simply not use the three right most bits of S to convey information. Thus, channel bit errors of four or less bits cannot cause four byte decoded errors. Further restricting S to 23 code words that end in {010} provides some added timing information.

An encoding technique is possible that uses relatively small size tables for encoding according to a novel algebraic method based on mixed radix number systems. Denote the two input data bytes to be encoded as d1 and d2, respectively, where d1 and d2 are considered as integers on [0 . . . 255]. The encoding proceeds according to the following steps:

1) Test to determine if d1 is in G. For simplicity, label the |G|=254 elements with the integers on [0 . . . 253]. Note this test is simple to implement: if d1=254 or 255 then d1 doesn't map under G, else it does map. Similarly test if d2 is in G.

2) If d1 is in G AND d2 is in G, then the output is simply the two 9-bit symbols C1 and C2 mapped by d1 and d2 on G, respectively.

3) If d1 is in G AND d2 is NOT in G, then the output C1 and C2 are {E,S} as follows. Calculate the exception (exn) number:

exn=(d2−|G|)*|G|+d1.

Go to (6).

4) If d1 is NOT in G AND d2 is in G, then the output C1 and C2 are {E,S} as follows. Calculate the exception number:

exn=(d1−|G|)*|G|+d2+(256−|G|)*|G|.

Go to (6).

5) If d1 is Not in G AND d2 is Not in G, then the output C1 and C2 are {E,S} as follows. Calculate the Exception number;

exn=(d1−|G|)*(256−|G|)+(d2−|G|)+2*(256−|G|)*|G|.

Go to (6).

6) e_val=fix(exn/|S|), where fix is largest integer. s_val= rem(exn, |S|), where rem is the remainder of exn/|S|. C1 is the word in E mapped by e_val.

C2 is the word in S mapped by s_val.

The decoding process is a straightforward inverse of the encoding operation. However, it is desirable to handle error events with some caution so as to achieve the desired low error propagation. Because a sequence detector matched to the k-mod-3=p constraint can never output quadbits or tribits in the wrong mod-3 phase, there are only a few possible invalid code words (misdetected code words), and almost all of those have been eliminated by our constrained choice of S.

The decoding process is then simply:

1) Test C1 to see if it is in E (i.e., whether the last three bits of C1 are {011}).
2) If C1 is NOT in E, then decode C1 to d1 and C2 to d2 using the inverse map of G. Notice that the only ambiguities possible are the all zero word in C1 OR C2, OR if C2 is in E (instead of G). The inverse map can be designed to output an erasure symbol or a nearest code word in these cases.
3) If C1 is in E, then use the inverse map of E to map C1 to e_val, and use the inverse map of S to map C2 to s_val. Note that the inverse map of S should be constructed such that the last three bits are not used. Calculate the exception number:

exn=e_val*|S|+s_val.

4) If exn<|G|*(256−|G|), then d1 is in G AND d2 is NOT in G, so d1=rem(exn, |G|)

d2=|G|+fix(exn/|G|).

5) Else if exn<2*|G|*(256−|G|), then d1 is NOT in G AND d2 is in G, so exn'=exn−|G|*(256−|G|)

d2=rem(exn',|G|)

d1=|G|+fix(exn'/|G|).

6) Else if exn<2*|G|*(256−|G|)+(256−|G|)$^2$, then d1 is NOT in G AND d2 is NOT in G, so exn''=exn−2*|G|*(256−|G|)

d2=|G|+rem(exn'',|G|)

d1=|G|+fix(exn''/|G|).

7) Else the exception number exn is out of range—output an erasure pointer or closest valid code word.

Thus, a simple methodology is shown to achieve a 16/18 block code. Notice that the algebraic operations are quite simple—add, multiply, remainder and quotient (fix) of simple division. Because only one encode/decode operation is performed every 16/18 bits, there is ample time for bit serial division, etc. Also notice that the tables are quite small. For encode, the G table is 254 words of 9 bits, the E table is 46 words of 9 bits, and the S table is 23 words of 9 bits. For decode, the inverse G table (if not associative memory) has 9 input bits so 512 words of 8 bits. Illegal words can be either mapped to nearby valid words in G or can be marked as erasures by using the illegal inverse mappings of 255 or 254 (decimal). The inverse E table only has 6 unique input bits (because the last three are {011}) so only 64 words of 8 bits are required. Illegal words can again be mapped or erased. The inverse S table has only 5 unique input bits (because the first bit is 0 and the last three bits are {010}) so only 32 words of 8 bits are required. Illegal words can again be mapped or erased. Table 4 shows example code word sets for {G}, Table 5 for {E}, and Table 6 for {S}:

TABLE 4 {G}

| binary | decimal |
|---|---|
| 000000001 | 0 |
| 000000010 | 1 |
| 000000100 | 2 |
| 000000101 | 3 |
| 000000110 | 4 |
| 000001000 | 5 |
| 000001001 | 6 |
| 000001010 | 7 |
| 000001100 | 8 |
| 000001101 | 9 |
| 000001110 | 10 |
| 000010000 | 11 |
| 000010001 | 12 |
| 000010010 | 13 |
| 000010100 | 14 |
| 000010101 | 15 |
| 000010110 | 16 |
| 000011000 | 17 |
| 000011001 | 18 |
| 000011010 | 19 |
| 000100000 | 20 |
| 000100001 | 21 |
| 000100010 | 22 |
| 000100100 | 23 |
| 000100101 | 24 |
| 000100110 | 25 |
| 000101000 | 26 |
| 000101001 | 27 |
| 000101010 | 28 |
| 000101100 | 29 |
| 000101101 | 30 |
| 000101110 | 31 |
| 000110000 | 32 |
| 000110001 | 33 |
| 000110010 | 34 |
| 000110100 | 35 |
| 000110101 | 36 |
| 000110110 | 37 |
| 001000000 | 38 |
| 001000001 | 39 |
| 001000010 | 40 |
| 001000100 | 41 |
| 001000101 | 42 |
| 001000110 | 43 |
| 001001000 | 44 |
| 001001001 | 45 |
| 001001010 | 46 |
| 001001100 | 47 |
| 001001101 | 48 |
| 001001110 | 49 |
| 001010000 | 50 |
| 001010001 | 51 |
| 001010010 | 52 |
| 001010100 | 53 |
| 001010101 | 54 |
| 001010110 | 55 |
| 001011000 | 56 |
| 001011001 | 57 |
| 001011010 | 58 |
| 001100000 | 59 |
| 001100001 | 60 |
| 001100010 | 61 |
| 001100100 | 62 |
| 001100101 | 63 |
| 001100110 | 64 |
| 001101000 | 65 |
| 001101001 | 66 |

TABLE 4 {G}-continued

| binary | decimal |
|---|---|
| 001101010 | 67 |
| 001101100 | 68 |
| 001101101 | 69 |
| 001101110 | 70 |
| 001110000 | 71 |
| 001110001 | 72 |
| 001110010 | 73 |
| 001110100 | 74 |
| 001110101 | 75 |
| 001110110 | 76 |
| 010000000 | 77 |
| 010000001 | 78 |
| 010000010 | 79 |
| 010000100 | 80 |
| 010000101 | 81 |
| 010000110 | 82 |
| 010001000 | 83 |
| 010001001 | 84 |
| 010001010 | 85 |
| 010001100 | 86 |
| 010001101 | 87 |
| 010001110 | 88 |
| 010010000 | 89 |
| 010010001 | 90 |
| 010010010 | 91 |
| 010010100 | 92 |
| 010010101 | 93 |
| 010010110 | 94 |
| 010011000 | 95 |
| 010011001 | 96 |
| 010011010 | 97 |
| 010100000 | 98 |
| 010100001 | 99 |
| 010100010 | 100 |
| 010100100 | 101 |
| 010100101 | 102 |
| 010100110 | 103 |
| 010101000 | 104 |
| 010101001 | 105 |
| 010101010 | 106 |
| 010101100 | 107 |
| 010101101 | 108 |
| 010101110 | 109 |
| 010110000 | 110 |
| 010110001 | 111 |
| 010110010 | 112 |
| 010110100 | 113 |
| 010110101 | 114 |
| 010110110 | 115 |
| 011000000 | 116 |
| 011000001 | 117 |
| 011000010 | 118 |
| 011000100 | 119 |
| 011000101 | 120 |
| 011000110 | 121 |
| 011001000 | 122 |
| 011001001 | 123 |
| 011001010 | 124 |
| 011001100 | 125 |
| 011001101 | 126 |
| 011001110 | 127 |
| 011010000 | 128 |
| 011010001 | 129 |
| 011010010 | 130 |
| 011010100 | 131 |
| 011010101 | 132 |
| 011010110 | 133 |
| 011011000 | 134 |
| 011011001 | 135 |
| 011011010 | 136 |
| 100000000 | 137 |
| 100000001 | 138 |
| 100000010 | 139 |
| 100000100 | 140 |
| 100000101 | 141 |
| 100000110 | 142 |
| 100001000 | 143 |

TABLE 4 {G}-continued

| binary | decimal |
|---|---|
| 100001001 | 144 |
| 100001010 | 145 |
| 100001100 | 146 |
| 100001101 | 147 |
| 100001110 | 148 |
| 100010000 | 149 |
| 100010001 | 150 |
| 100010010 | 151 |
| 100010100 | 152 |
| 100010101 | 153 |
| 100010110 | 154 |
| 100011000 | 155 |
| 100011001 | 156 |
| 100011010 | 157 |
| 100100000 | 158 |
| 100100001 | 159 |
| 100100010 | 160 |
| 100100100 | 161 |
| 100100101 | 162 |
| 100100110 | 163 |
| 100101000 | 164 |
| 100101001 | 165 |
| 100101010 | 166 |
| 100101100 | 167 |
| 100101101 | 168 |
| 100101110 | 169 |
| 100110000 | 170 |
| 100110001 | 171 |
| 100110010 | 172 |
| 100110100 | 173 |
| 100110101 | 174 |
| 100110110 | 175 |
| 101000000 | 176 |
| 101000001 | 177 |
| 101000010 | 178 |
| 101000100 | 179 |
| 101000101 | 180 |
| 101000110 | 181 |
| 101001000 | 182 |
| 101001001 | 183 |
| 101001010 | 184 |
| 101001100 | 185 |
| 101001101 | 186 |
| 101001110 | 187 |
| 101010000 | 188 |
| 101010001 | 189 |
| 101010010 | 190 |
| 101010100 | 191 |
| 101010101 | 192 |
| 101010110 | 193 |
| 101011000 | 194 |
| 101011001 | 195 |
| 101011010 | 196 |
| 101100000 | 197 |
| 101100001 | 198 |
| 101100010 | 199 |
| 101100100 | 200 |
| 101100101 | 201 |
| 101100110 | 202 |
| 101101000 | 203 |
| 101101001 | 204 |
| 101101010 | 205 |
| 101101100 | 206 |
| 101101101 | 207 |
| 101101110 | 208 |
| 101110000 | 209 |
| 101110001 | 210 |
| 101110010 | 211 |
| 101110100 | 212 |
| 101110101 | 213 |
| 101110110 | 214 |
| 110000000 | 215 |
| 110000001 | 216 |
| 110000010 | 217 |
| 110000100 | 218 |
| 110000101 | 219 |
| 110000110 | 220 |

TABLE 4 {G}-continued

| binary | decimal |
|---|---|
| 110001000 | 221 |
| 110001001 | 222 |
| 110001010 | 223 |
| 110001100 | 224 |
| 110001101 | 225 |
| 110001110 | 226 |
| 110010000 | 227 |
| 110010001 | 228 |
| 110010010 | 229 |
| 110010100 | 230 |
| 110010101 | 231 |
| 110010110 | 232 |
| 110011000 | 233 |
| 110011001 | 234 |
| 110011010 | 235 |
| 110100000 | 236 |
| 110100001 | 237 |
| 110100010 | 238 |
| 110100100 | 239 |
| 110100101 | 240 |
| 110100110 | 241 |
| 110101000 | 242 |
| 110101001 | 243 |
| 110101010 | 244 |
| 110101100 | 245 |
| 110101101 | 246 |
| 110101110 | 247 |
| 110110000 | 248 |
| 110110001 | 249 |
| 110110010 | 250 |
| 110110100 | 251 |
| 110110101 | 252 |
| 110110110 | 253 |

TABLE 5 {E}

| binary | decimal |
|---|---|
| 000000011 | 0 |
| 000001011 | 1 |
| 000010011 | 2 |
| 000011011 | 3 |
| 000100011 | 4 |
| 000101011 | 5 |
| 000110011 | 6 |
| 001000011 | 7 |
| 001001011 | 8 |
| 001010011 | 9 |
| 001011011 | 10 |
| 001100011 | 11 |
| 001101011 | 12 |
| 001110011 | 13 |
| 010000011 | 14 |
| 010001011 | 15 |
| 010010011 | 16 |
| 010011011 | 17 |
| 010100011 | 18 |
| 010101011 | 19 |
| 010110011 | 20 |
| 011000011 | 21 |
| 011001011 | 22 |
| 011010011 | 23 |
| 011011011 | 24 |
| 100000011 | 25 |
| 100001011 | 26 |
| 100010011 | 27 |
| 100011011 | 28 |
| 100100011 | 29 |
| 100101011 | 30 |
| 100110011 | 31 |
| 101000011 | 32 |
| 101001011 | 33 |
| 101010011 | 34 |
| 101011011 | 35 |

TABLE 5 {E}-continued

| binary | decimal |
|---|---|
| 101100011 | 36 |
| 101101011 | 37 |
| 101110011 | 38 |
| 110000011 | 39 |
| 110001011 | 40 |
| 110010011 | 41 |
| 110011011 | 42 |
| 110100011 | 43 |
| 110101011 | 44 |
| 110110011 | 45 |

TABLE 6 {S}

| binary | decimal |
|---|---|
| 000000010 | 0 |
| 000001010 | 1 |
| 000010010 | 2 |
| 000011010 | 3 |
| 000100010 | 4 |
| 000101010 | 5 |
| 000110010 | 6 |
| 001000010 | 7 |
| 001001010 | 8 |
| 001010010 | 9 |
| 001011010 | 10 |
| 001100010 | 11 |
| 001101010 | 12 |
| 010000010 | 13 |
| 010001010 | 14 |
| 010010010 | 15 |
| 010011010 | 16 |
| 010100010 | 17 |
| 010101010 | 18 |
| 010110010 | 19 |
| 011000010 | 20 |
| 011001010 | 21 |
| 011010010 | 22 |

The k-mod-3=p constraint and the algebraic mixed radix number system encoding method can be simply extended to very long block codes without requiring very large tables. For example, block codes of length N=3P can be constructed by considering the following: Define a new class of code word M which starts with 0, ends with {011}, and meets the other k-mod-3=p constraints. M is thus a subset of E, i.e., all E which start with 0. Code words of three sub-blocks can now be constructed in the following 4 ways:

{G,G,G}, {G,E,S}, {E,S,G}, and {E,M,S}.

It is clear that this construction embodies every codeword of length 3P meeting the k-mod-3=p constraint. But again to insure adequate timing, the all zero sub-block word is typically dropped. The decoding process checks the last three bits of C1 and C2 to determine if they are in E or M. Similarly, all code words of length N=4P are constructed from the 8 patterns:

{G,G,G,G}, {G,G,E,S}, {G,E,S,G}, {E,S,G,G}, {E,S,E,S}, {G,E,M,S}, {E,M,S,G}, and {E,M,M,G}.

A rate 9/10 k-mod-3=p block code of N=60 exists. Good sub-block factorizations are k=5 blocks of P=12, or k=4 blocks of P=15.

Those skilled in the art will recognize that the k-mod-3=p constraint of the present invention, as described in detail above, can easily be generalized to a constraint of k-mod-n=p where n is a predetermined integer. In other words, other codes may exist that comprise a constraint similar to the k-mod-3=p constraint, and which provide a similar distance enhancing effect. For example, a trellis code constructed according to a k-mod-2=p constraint provides a similar distance enhancing property as the k-mod-3=p constraint. A rate 8/9 code that satisfies the k-mod-2=p constraint implemented as a simple lookup table is shown in Table 7.

TABLE 7

| binary | decimal |
|---|---|
| 000001000 | 0 |
| 000001001 | 1 |
| 000001010 | 2 |
| 000001100 | 3 |
| 000001101 | 4 |
| 000001110 | 5 |
| 000010000 | 6 |
| 000010001 | 7 |
| 000010010 | 8 |
| 000010100 | 9 |
| 000010101 | 10 |
| 000010110 | 11 |
| 000011000 | 12 |
| 000011001 | 13 |
| 000011010 | 14 |
| 000100000 | 15 |
| 000100001 | 16 |
| 000100010 | 17 |
| 000100100 | 18 |
| 000100101 | 19 |
| 000100110 | 20 |
| 000101000 | 21 |
| 000101001 | 22 |
| 000101010 | 23 |
| 000101100 | 24 |
| 000101101 | 25 |
| 000101110 | 26 |
| 000110000 | 27 |
| 000110001 | 28 |
| 000110010 | 29 |
| 000110100 | 30 |
| 000110101 | 31 |
| 000110110 | 32 |
| 000111000 | 33 |
| 000111001 | 34 |
| 000111010 | 35 |
| 001000000 | 36 |
| 001000001 | 37 |
| 001000010 | 38 |
| 001000100 | 39 |
| 001000101 | 40 |
| 001000110 | 41 |
| 001001000 | 42 |
| 001001001 | 43 |
| 001001010 | 44 |
| 001001100 | 45 |
| 001001101 | 46 |
| 001001110 | 47 |
| 001010000 | 48 |
| 001010001 | 49 |
| 001010010 | 50 |
| 001010100 | 51 |
| 001010101 | 52 |
| 001010110 | 53 |
| 001011000 | 54 |
| 001011001 | 55 |
| 001011010 | 56 |
| 001100000 | 57 |
| 001100001 | 58 |
| 001100010 | 59 |
| 001100100 | 60 |
| 001100101 | 61 |
| 001100110 | 62 |
| 001101000 | 63 |
| 001101001 | 64 |
| 001101010 | 65 |
| 001101100 | 66 |
| 001101101 | 67 |

TABLE 7-continued

| binary | decimal |
|---|---|
| 001101110 | 68 |
| 010000001 | 69 |
| 010000010 | 70 |
| 010000100 | 71 |
| 010000101 | 72 |
| 010000110 | 73 |
| 010001000 | 74 |
| 010001001 | 75 |
| 010001010 | 76 |
| 010001100 | 77 |
| 010001101 | 78 |
| 010001110 | 79 |
| 010010000 | 80 |
| 010010001 | 81 |
| 010010010 | 82 |
| 010010100 | 83 |
| 010010101 | 84 |
| 010010110 | 85 |
| 010011000 | 86 |
| 010011001 | 87 |
| 010011010 | 88 |
| 010100000 | 89 |
| 010100001 | 90 |
| 010100010 | 91 |
| 010100100 | 92 |
| 010100101 | 93 |
| 010100110 | 94 |
| 010101000 | 95 |
| 010101001 | 96 |
| 010101010 | 97 |
| 010101100 | 98 |
| 010101101 | 99 |
| 010101110 | 100 |
| 010110000 | 101 |
| 010110001 | 102 |
| 010110010 | 103 |
| 010110100 | 104 |
| 010110101 | 105 |
| 010110110 | 106 |
| 010111000 | 107 |
| 010111001 | 108 |
| 010111010 | 109 |
| 011000000 | 110 |
| 011000001 | 111 |
| 011000010 | 112 |
| 011000100 | 113 |
| 011000101 | 114 |
| 011000110 | 115 |
| 011001000 | 116 |
| 011001001 | 117 |
| 011001010 | 118 |
| 011001101 | 119 |
| 011001110 | 120 |
| 011010000 | 121 |
| 011010001 | 122 |
| 011010010 | 123 |
| 011010100 | 124 |
| 011010101 | 125 |
| 011010110 | 126 |
| 011011000 | 127 |
| 011011001 | 128 |
| 011011010 | 129 |
| 011100000 | 130 |
| 011100001 | 131 |
| 011100010 | 132 |
| 011100100 | 133 |
| 011100101 | 134 |
| 011100110 | 135 |
| 011101000 | 136 |
| 011101001 | 137 |
| 011101010 | 138 |
| 011101100 | 139 |
| 011101101 | 140 |
| 011101110 | 141 |
| 100000001 | 142 |
| 100000010 | 143 |
| 100000100 | 144 |

TABLE 7-continued

| binary | decimal |
|---|---|
| 100000101 | 145 |
| 100000110 | 146 |
| 100001000 | 147 |
| 100001001 | 148 |
| 100001010 | 149 |
| 100001100 | 150 |
| 100001101 | 151 |
| 100001110 | 152 |
| 100010000 | 153 |
| 100010001 | 154 |
| 100010010 | 155 |
| 100010100 | 156 |
| 100010101 | 157 |
| 100010110 | 158 |
| 100011000 | 159 |
| 100011001 | 160 |
| 100011010 | 161 |
| 100100000 | 162 |
| 100100001 | 163 |
| 100100010 | 164 |
| 100100100 | 165 |
| 100100101 | 166 |
| 100100110 | 167 |
| 100101000 | 168 |
| 100101001 | 169 |
| 100101010 | 170 |
| 100101100 | 171 |
| 100101101 | 172 |
| 100101110 | 173 |
| 100110000 | 174 |
| 100110001 | 175 |
| 100110010 | 176 |
| 100110100 | 177 |
| 100110101 | 178 |
| 100110110 | 179 |
| 100111000 | 180 |
| 100111001 | 181 |
| 100111010 | 182 |
| 101000000 | 183 |
| 101000001 | 184 |
| 101000010 | 185 |
| 101000100 | 186 |
| 101000101 | 187 |
| 101000110 | 188 |
| 101001000 | 189 |
| 101001001 | 190 |
| 101001010 | 191 |
| 101001100 | 192 |
| 101001101 | 193 |
| 101001110 | 194 |
| 101010000 | 195 |
| 101010001 | 196 |
| 101010010 | 197 |
| 101010100 | 198 |
| 101010101 | 199 |
| 101010110 | 200 |
| 101011000 | 201 |
| 101011001 | 202 |
| 101011010 | 203 |
| 101100000 | 204 |
| 101100001 | 205 |
| 101100010 | 206 |
| 101100100 | 207 |
| 101100101 | 208 |
| 101100110 | 209 |
| 101101000 | 210 |
| 101101001 | 211 |
| 101101010 | 212 |
| 101101100 | 213 |
| 101101101 | 214 |
| 101101110 | 215 |
| 110000001 | 216 |
| 110000010 | 217 |
| 110000100 | 218 |
| 110000101 | 219 |
| 110000110 | 220 |
| 110001000 | 221 |
| 110001001 | 222 |
| 110001010 | 223 |
| 110001100 | 224 |
| 110001101 | 225 |
| 110001110 | 226 |
| 110010000 | 227 |
| 110010001 | 228 |
| 110010010 | 229 |
| 110010100 | 230 |
| 110010101 | 231 |
| 110010110 | 232 |
| 110011000 | 233 |
| 110011010 | 234 |
| 110100000 | 235 |
| 110100001 | 236 |
| 110100010 | 237 |
| 110100100 | 238 |
| 110100101 | 239 |
| 110100110 | 240 |
| 110101000 | 241 |
| 110101001 | 242 |
| 110101010 | 243 |
| 110101100 | 244 |
| 110101101 | 245 |
| 110101110 | 246 |
| 110110000 | 247 |
| 110110001 | 248 |
| 110110010 | 249 |
| 110110100 | 250 |
| 110110101 | 251 |
| 110110110 | 252 |
| 110111000 | 253 |
| 110111001 | 254 |
| 110111010 | 255 |

The objects of the present invention have been fully realized through the example embodiments disclosed herein. Those skilled in the art will appreciate that the various aspects of the present invention may be implemented in differing embodiments without departing from the essential function. For example, the trellis code of the present invention could be applied to other types of trellis sequence detectors, such as a PR4 sequence detector, and provide similar distance enhancing improvements as described above. These and other like modifications are within the intended scope of the present invention. The examples provided above are not limiting in the sense that the law allows an interpretation extending to the boundaries of the prior art. The scope of the present invention should, therefore, be determined with respect to the limitations set forth in the claims that follow.

We claim:

1. A sampled amplitude read channel for reading data from a sequence of discrete time sample values generated by sampling an analog read signal emanating from a read head positioned over a storage medium, comprising:

(a) a sampling device for sampling the analog read signal to generate the sequence of discrete time sample values;

(b) a detector for detecting the data from the discrete time sample values; and (c) an encoder/decoder for encoding/decoding the data according to a code constraint which allows runs of X consecutive storage medium transitions to occur only if started at a predetermined periodic data index k, wherein (i) X is an integer greater than one;

(ii) the periodic data index k is defined over a predetermined number of data indices as k modulo N=P where P is an integer constant and N is an integer greater than one; and (iii) the encoder/decoder encodes m bits of user data into n bits of codeword where the code rate m/n is greater than ¾.

2. The sampled amplitude read channel as recited in claim 1, wherein X=3 and N=3.

3. The sampled amplitude read channel as recited in claim 1, wherein X=3 and N=2.

4. The sampled amplitude read channel as recited in claim 1, wherein the code constraint further codes out all runs of J or more consecutive storage medium transitions, where J is an integer greater than N.

5. The sampled amplitude read channel as recited in claim 4, wherein N=3 and J=4.

6. The sampled amplitude read channel as recited in claim 1, further comprising an equalizer for equalizing the read channel according to a predetermined response.

7. The sampled amplitude read channel as recited in claim 6, wherein the response is selected from a group of partial responses characterized by $(1-D)(1+D)^n$, where n is an integer.

8. The sampled amplitude read channel as recited in claim 1, further comprising a time varying sequence detector that operates according to a time varying trellis state machine.

9. The sampled amplitude read channel as recited in claim 8, wherein the trellis state machine changes structure at data indices k modulo N=C, where C is an integer constant.

10. The sampled amplitude read channel as recited in claim 1, further comprising interpolated timing recovery for generating a sequence of interpolated sample values substantially synchronized to a data modulation rate, wherein the detector detects the data from the interpolated sample values.

11. The sampled amplitude read channel as recited in claim 1, further comprising timing recovery for synchronizing the sample values to a data modulation rate, wherein a sampling rate of the sampling device is less than 91% of the data modulation rate.

12. A sampled amplitude read channel for reading data from a sequence of discrete time sample values generated by sampling an analog read signal emanating from a read head positioned over a storage medium, comprising:

(a) a sampling device for sampling the analog read signal to generate the sequence of discrete time sample values;

(b) an equalizer for equalizing the read channel according to an EEPR4 partial response;

(c) a sequence detector that operates according to a time varying trellis state machine such that $d_{min}^2 \geq 8$, the sequence detector for detecting the data from the sample values; and (d) an encoder/decoder for encoding/decoding the data according to a code constraint which allows runs of X consecutive storage medium transitions to occur only if started at a predetermined periodic data index k, wherein:

(i) x is an integer greater than one;

(ii) the periodic data index k is defined over a predetermined number of data indices as k modulo N=P where P is an integer constant and N is an integer greater than one; and (iii) the encoder/decoder encodes m bits of user data into n bits of codeword where the code rate m/n is greater than ½.

13. The sampled amplitude read channel as recited in claim 12, wherein the trellis state machine changes structure at data indices k modulo N=C, where C is an integer constant and N is an integer greater than one.

14. A sampled amplitude read channel for reading data from a sequence of discrete time sample values generated by sampling an analog read signal emanating from a read head positioned over a storage medium, comprising:

(a) a sampling device for sampling the analog read signal to generate the sequence of discrete time sample values;

(b) interpolated timing recovery for generating a sequence of interpolated sample values substantially synchronized to a data modulation rate; and (c) a sequence detector that operates according to a time varying trellis state machine, the sequence detector for detecting the data from the interpolated sample values.

15. The sampled amplitude read channel as recited in claim 14, wherein the trellis state machine changes structure at data indices k modulo N=C, where C is an integer constant and N is an integer greater than one.

16. The sampled amplitude read channel as recited in claim 14, further comprising an encoder/decoder for encoding/decoding the data according to a code constraint which allows runs of X consecutive storage medium transitions to occur only if started at a predetermined periodic data index k, wherein:

(a) X is an integer greater than one; and (b) the periodic data index k is defined over a predetermined number of data indices as k modulo N=P where P is an integer constant and N is an integer greater than one.

17. A sampled amplitude read channel for reading data from a sequence of discrete time sample values generated by sampling an analog read signal emanating from a read head positioned over a storage medium, comprising:

(a) a sampling device for sub-sampling the analog read signal at a rate of less than 91% of a data modulation rate to generate the sequence of discrete time sample values;

(b) timing recovery for synchronizing the sample values to a data modulation rate, thereby forming substantially synchronous sample values; and (c) a sequence detector that operates according to a time varying trellis state machine, the sequence detector for detecting the data from the substantially synchronous sample values.

18. The sampled amplitude read channel as recited in claim 17, wherein the time varying trellis state machine changes structure at data indices k modulo N=C, where C is an integer constant and N is an integer greater than one.

19. The sampled amplitude read channel as recited in claim 17, further comprising an encoder/decoder for encoding/decoding the data according to a code constraint which allows runs of X consecutive storage medium transitions to occur only if started at a predetermined periodic data index k, wherein:

(a) X is an integer greater than one; and (b) the periodic data index k is defined over a predetermined number of data indices as k modulo N=P where P is an integer constant and N is an integer greater than one.

20. A sampled amplitude read channel for reading data from a sequence of discrete time sample values generated by sampling an analog read signal emanating from a read head positioned over a storage medium, comprising:

(a) a sampling device for sampling the analog read signal to generate the sequence of discrete time sample values;

(b) interpolated timing recovery for generating a sequence of interpolated sample values substantially synchronized to a data modulation rate;

(c) a sequence detector for detecting the data from the interpolated sample values; and (d) an encoder/decoder for encoding/decoding the data according to a code constraint which allows runs of X consecutive storage medium transitions to occur only if started at a predetermined periodic data index k, wherein:

(i) X is an integer greater than one;

(ii) the periodic data index k is defined over a predetermined number of data indices as k modulo N=P where P is an integer constant and N is an integer greater than one; and (iii) the encoder/decoder encodes m bits of user data into n bits of codeword where the code rate m/n is greater than ¾.

* * * * *